(12) United States Patent
Yamashita et al.

(10) Patent No.: US 8,900,962 B2
(45) Date of Patent: Dec. 2, 2014

(54) METHOD FOR MANUFACTURING SEMICONDUCTOR DEVICE

(75) Inventors: Daisuke Yamashita, Hyogo-ken (JP); Etsuo Hamada, Hyogo-ken (JP); Hideki Nozaki, Hyogo-ken (JP); Hironobu Shibata, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 701 days.

(21) Appl. No.: 13/052,309

(22) Filed: Mar. 21, 2011

(65) Prior Publication Data
US 2011/0250728 A1 Oct. 13, 2011

(30) Foreign Application Priority Data
Apr. 7, 2010 (JP) .................................. 2010-88676

(51) Int. Cl.
| | |
|---|---|
| H01L 21/331 | (2006.01) |
| H01L 29/66 | (2006.01) |
| H01L 21/268 | (2006.01) |
| H01L 29/739 | (2006.01) |
| H01L 29/08 | (2006.01) |
| H01L 21/266 | (2006.01) |
| H01L 21/265 | (2006.01) |

(52) U.S. Cl.
CPC ........ *H01L 29/66333* (2013.01); *H01L 21/268* (2013.01); *H01L 21/26513* (2013.01); *H01L 29/7395* (2013.01); *H01L 29/0834* (2013.01); *H01L 21/266* (2013.01)
USPC ........... 438/373; 438/378; 438/519; 438/542; 438/549

(58) Field of Classification Search
CPC ............ H01L 29/0834; H01L 29/7395; H01L 29/66333; H01L 21/266; H01L 21/268

USPC ......... 438/350, 373, 510, 514, 519, 522, 523, 438/524, 525, 530, 533, 549, 550, 551, 552, 438/542, 544
See application file for complete search history.

(56) References Cited

U.S. PATENT DOCUMENTS

| | | | |
|---|---|---|---|
| 6,562,705 B1 | 5/2003 | Obara et al. | |
| 6,649,981 B2* | 11/2003 | Kobayashi et al. | 257/362 |

(Continued)

FOREIGN PATENT DOCUMENTS

| | | |
|---|---|---|
| JP | 2008-098530 | 4/2008 |
| JP | 2009-158922 | 7/2009 |
| JP | 2010272587 A | 12/2010 |

OTHER PUBLICATIONS

Japanese Office Action issued on Dec. 19, 2013 in corresponding Japanese Application No. 2010-088676, along with English translation.

(Continued)

*Primary Examiner* — Jae Lee
*Assistant Examiner* — Quovaunda V Jefferson
(74) *Attorney, Agent, or Firm* — White & Case LLP

(57) ABSTRACT

According to one embodiment, a method is disclosed for manufacturing a semiconductor device. The method can include forming a base region and an emitter region in a front surface of a semiconductor layer. The method can include forming a first impurity implantation region by implanting first impurity of a first conductivity type into a back surface of the semiconductor layer. The method can include selectively forming a second impurity implantation region by selectively implanting second impurity of a second conductivity type into the first impurity implantation region. In addition, the method can include irradiating the first impurity implantation region and the second impurity implantation region with laser light. A peak of impurity concentration profile in a depth direction of at least one of the first impurity implantation region and the second impurity implantation region before irradiation with the laser light is adjusted to a depth of 0.05 μm or more and 0.3 μm or less from the back surface of the semiconductor layer.

7 Claims, 21 Drawing Sheets

(56) References Cited

U.S. PATENT DOCUMENTS

2002/0127783 A1* 9/2002 Otsuki et al. .................. 438/138
2008/0090391 A1* 4/2008 Tsuchitani et al. ........... 438/510
2009/0267200 A1 10/2009 Gutt et al.

OTHER PUBLICATIONS

Japanese Office Action issued on Sep. 3, 2014 in corresponding Japanese Application No. 2010-088676, along with English translation thereof.

* cited by examiner

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2010-88676, filed on Apr. 7, 2010; the entire contents of which are incorporated herein by reference.

FIELD

Embodiments described herein relate generally to a method for manufacturing a semiconductor device.

BACKGROUND

An IGBT (insulated gate bipolar transistor) can be integrated with a diode to form a semiconductor device such as a reverse conducting IGBT. In such a semiconductor device, on the front surface side of a semiconductor layer, a MOS structure (e.g., a structure including an emitter region, a collector region, and a gate electrode provided on the emitter region via an insulating film) is provided. On the back surface side of the semiconductor layer, a p-type contact region as a collector region of the IGBT and an n-type contact region as a cathode region of the diode are provided. A back surface electrode is connected to the p-type contact region and the n-type contact region.

In forming the p-type contact region and the n-type contact region, typically, p-type impurity and n-type impurity, respectively, are selectively implanted into the back surface of the semiconductor layer and activated by heating. The back surface of the semiconductor layer may be polished to thin the semiconductor device. Activation of the p-type contact region and the n-type contact region is often performed by interrupting the MOS manufacturing process to avoid thermal damage to the MOS structure formed on the front surface side of the semiconductor layer.

However, in the MOS manufacturing process, if the thickness of the semiconductor layer is thinned, cracking and chipping may occur in the semiconductor layer during the process. Furthermore, if the thickness of the semiconductor layer is varied by polishing during the MOS manufacturing process, dedicated systems are required for different thicknesses before and after the polishing. This incurs the increase of manufacturing cost.

Furthermore, for instance, if the projection range of impurity of the n-type contact region is too shallow, n-type impurity may scatter to the p-type contact region during activation. This may increase the contact resistance between each contact region and the back surface electrode and impair the device characteristics. Conversely, if the projection range of impurity is too deep, activation of impurity in each contact region may end up in failure and again impair the device characteristics.

BRIEF DESCRIPTION OF THE DRAWINGS

FIG. 2A shows the process of forming a MOS structure, and FIG. 2B shows the process of polishing the back surface of a semiconductor layer;

FIG. 3A shows the process of implanting p-type impurity, and FIG. 3B shows the process of implanting n-type impurity;

FIG. 5A shows the laser annealing process, and FIG. 5B shows the process of forming a back surface electrode;

FIG. 6A illustrates an impurity implantation region irradiated with laser light in the case where the peak position of the impurity concentration profile of n-type impurity is less than 0.05 µm, and FIG. 6B illustrates an impurity implantation region irradiated with laser light in the case where the peak position of the impurity concentration profile of n-type impurity is more than 0.3 µm;

FIG. 7A illustrates the effect of laser annealing in the case where the peak position of the impurity concentration profile of n-type impurity is 0.04 to 0.05 µm, and FIG. 7B illustrates the effect of laser annealing in the case where the peak position of the impurity concentration profile of n-type impurity is 0.30 to 0.35 µm.

FIG. 8A illustrates the effect of laser annealing in the case where the peak position of the impurity concentration profile of n-type impurity is 0.04 µm, and FIG. 8B illustrates the effect of laser annealing in the case where the peak position of the impurity concentration profile of n-type impurity is 0.05 µm.

FIG. 9A is a schematic plan view of the first mask, and FIG. 9B is a schematic sectional view taken along X-X' of FIG. 9A;

FIG. 10A is a schematic plan view of the second mask, and FIG. 10B is a schematic sectional view taken along X-X' of FIG. 10A;

FIG. 11A is a schematic plan view of the third mask, and FIG. 11B is a schematic sectional view taken along X-X' of FIG. 11A;

FIG. 12A shows the process of forming an SOG film, and FIG. 12B shows the process of processing the SOG film;

FIG. 13A shows the process of etching an impurity implantation region, and FIG. 13B shows the process of implanting n-type impurity;

FIG. 14A shows the laser annealing process, FIG. 14B shows the process of forming a metal film, and FIG. 14C is a partially enlarged view of FIG. 14B;

FIG. 15A shows the lift-off process for the SOG film, and FIG. 15B shows the process of forming a metal film;

FIG. 16A shows the process of implanting p-type impurity, and FIG. 16B shows the laser annealing process;

FIG. 17A shows the process of forming an SOG film, and FIG. 17B shows the process of placing a mask;

FIG. 18A shows the laser annealing process, and FIG. 18B shows the process of forming a main electrode;

FIG. 19A shows the process of placing a mask, and FIG. 19B shows the laser annealing process;

FIG. 20A shows the process of forming an SOG film, and FIG. 20B shows the process of processing the SOG film; FIG. 21A shows the process of implanting p-type impurity, and FIG. 21B shows the laser annealing process.

DETAILED DESCRIPTION

In general, according to one embodiment, a method is disclosed for manufacturing a semiconductor device. The method can include forming a base region and an emitter region in a front surface of a semiconductor layer. The method can include forming a first impurity implantation region by implanting first impurity of a first conductivity type into a back surface of the semiconductor layer. The method can include selectively forming a second impurity implantation region by selectively implanting second impurity of a second conductivity type into the first impurity implantation region. In addition, the method can include irradiating the first impurity implantation region and the second impurity implantation region with laser light. A peak of impurity concentration profile in a depth direction of at least one of the first impurity implantation region and the second impurity implantation region before irradiation with the laser light is adjusted to a depth of 0.05 μm or more and 0.3 μm or less from the back surface of the semiconductor layer.

Embodiments will now be described with reference to the drawings.

First Embodiment

Figure 1:
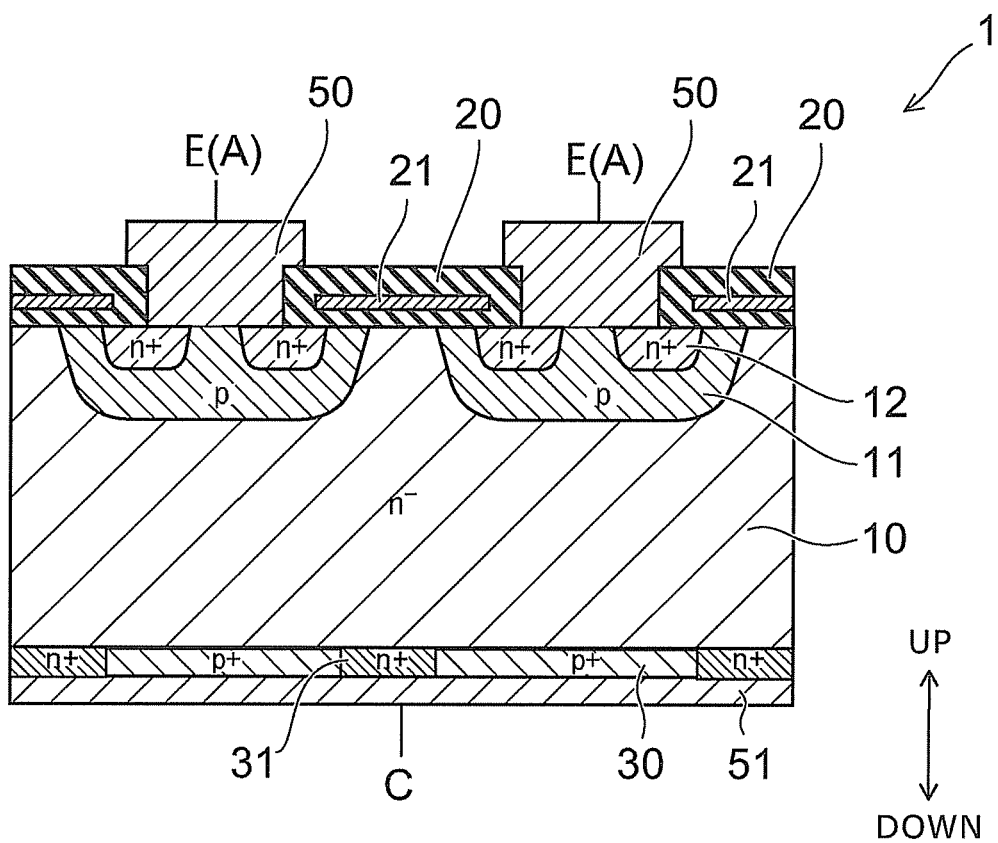
FIG. 1 is a main part schematic sectional view of a semiconductor device according to a first embodiment.

FIG. 1 is a main part schematic sectional view of a semiconductor device according to a first embodiment.

The semiconductor device 1 is a reverse conducting IGBT. The semiconductor device 1 includes a base region 11 and an emitter region 12 in the front surface of a semiconductor layer 10, and contact regions 30 and 31 in the back surface of the semiconductor layer 10. Furthermore, the semiconductor device 1 includes a gate electrode 21, a first main electrode 50, and a second main electrode 51.

In the semiconductor device 1, a p-type base region 11 is selectively provided in the front surface of an n⁻-type semiconductor layer 10. The thickness of the semiconductor layer 10 is e.g. 100 μm. An n⁺-type emitter region 12 is selectively provided in the surface of the base region 11. An insulating film 20 is provided from above the semiconductor layer 10 across the base region 11 to halfway above the emitter region 12. A gate electrode 21 as a control electrode is provided in the insulating film 20. Thus, on the front surface side of the semiconductor layer 10, a MOS structure is formed. The MOS structure includes the base region 11 formed in the front surface of the semiconductor layer, the emitter region 12 formed in the surface of the base region 11, and the gate electrode 21 opposed to the base region 11 across the insulating film 20.

In the back surface of the semiconductor layer 10, a p⁺-type contact region 30, and an n⁺-type contact region 31 adjacent to the contact region 30 are selectively provided. The thickness of the contact regions 30 and 31 is e.g. 0.2 to 1.0 μm.

Above the base region 11, a first main electrode 50 in contact with the emitter region 12 and the base region 11 is provided. The first main electrode 50 is ohmically connected to the emitter region 12. The first main electrode 50 is an emitter electrode for the IGBT and an anode electrode for the diode.

Below the semiconductor layer 10, a second main electrode 51 is provided via the contact regions 30 and 31. The p⁺-type contact region 30 is a collector region for the IGBT. The n⁺-type contact region 31 is a cathode region for the diode. The second main electrode 51 is ohmically connected to the contact regions 30 and 31. The first main electrode 50 and the second main electrode 51 are made of a material such as aluminum (Al) and aluminum alloy.

Thus, the semiconductor device 1 includes an IGBT including the first main electrode 50, the base region 11, the emitter region 12, the semiconductor layer 10, the contact region 30, the second main electrode 51, and the gate electrode 21, and a diode including the first main electrode 50, the base region 11, the semiconductor layer 10, and the contact region 31.

Although FIG. 1 illustrates the semiconductor device 1 of the planar gate structure, the semiconductor device of the embodiment may be of the trench gate structure.

Next, the operation of the semiconductor device 1 is described.

The second main electrode 51 is applied with a higher voltage than the first main electrode 50, and the gate electrode 21 is applied with a voltage higher than or equal to the threshold voltage (Vt). Then, the IGBT in the semiconductor device 1 is turned on. For instance, if the voltage of the gate electrode 21 is higher than or equal to the threshold voltage (Vt), a channel is formed in the base region 11 near the insulating film 20. Thus, electrons are injected from the first main electrode 50 through the emitter region 12 and the channel into the semiconductor layer 10, and holes are injected from the contact region 30 into the semiconductor layer 10. This decreases the resistance of the semiconductor layer 10 and increases the current capacity. That is, the IGBT of the semiconductor device 1 is operated, and a large current is conducted in the forward direction.

If the gate electrode 21 is applied with a voltage lower than the threshold voltage (Vt), no channel is formed, and the semiconductor device 1 is turned off. However, even if the voltage of the gate electrode 21 is lower than the threshold voltage (Vt), when the first main electrode 50 is applied with a higher voltage than the second main electrode 51, a forward bias is applied to the pn junction between the base region 11 and the semiconductor layer 10. Thus, holes are injected from the base region 11 into the semiconductor layer 10, and electrons are injected from the contact region 31 into the semiconductor layer 10. Thus, the semiconductor device 1 is placed in the conducting state. That is, the diode of the semiconductor device 1 is operated.

Next, a method for manufacturing the semiconductor device 1 is described.

In the following description, the contact regions 30 and 31 before laser annealing, i.e., before activation, are referred to as impurity implantation regions 30A and 31A. Furthermore, the impurity implantation region before being processed into the impurity implantation region 30A is referred to as impurity implantation region 30L.

Here, the impurity implantation regions 30A and 30L correspond to a first impurity implantation region, and the impurity implantation region 31A corresponds to a second impurity implantation region.

With regard to the conductivity type, it is assumed that the first conductivity type is p-type and the second conductivity type is n-type.

The peak position of the impurity concentration profile of impurity implanted into the impurity implantation region 30A, 31A according to the embodiment is controlled to a prescribed position.

Processes for manufacturing a semiconductor device according to the first embodiment are described.

Figure 2A:
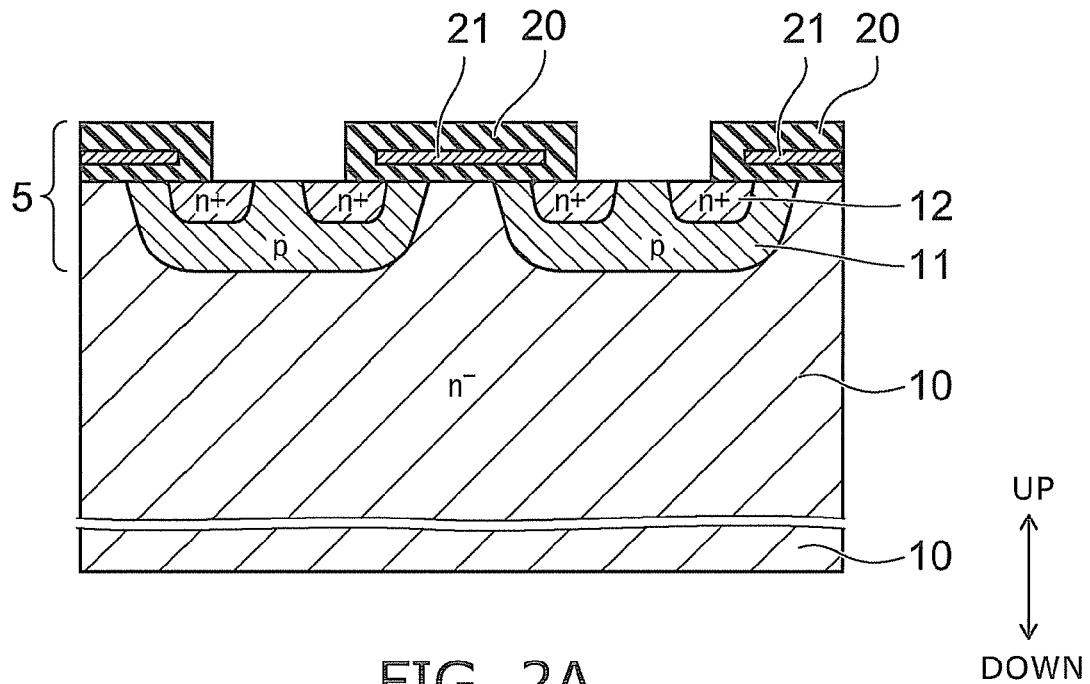
FIGS. 2A and 2B are main part sectional views illustrating processes for manufacturing the semiconductor device according to the first embodiment, where
Figure 2B:
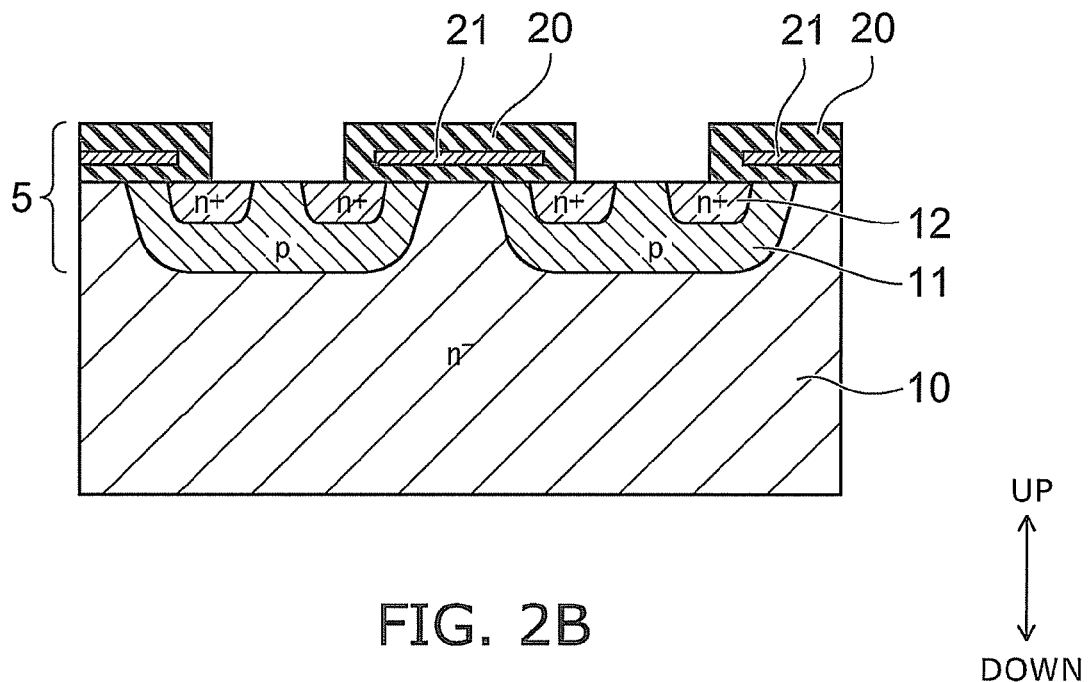

FIGS. 2A and 2B are main part sectional views illustrating the processes for manufacturing the semiconductor device according to the first embodiment. More specifically, FIG. 2A shows the process of forming a MOS structure, and FIG. 2B shows the process of polishing the back surface of the semiconductor layer.

First, as shown in FIG. 2A, an n⁻-type semiconductor layer 10 having a film thickness of approximately 600 μm is prepared. A MOS structure 5 is formed on the front surface side of the semiconductor layer 10. The MOS structure 5 includes a base region 11 formed in the front surface of the semiconductor layer, an emitter region 12 formed in the surface of the base region 11, and a gate electrode 21 opposed to the base region 11 across an insulating film 20. The insulating film 20 is formed from above the semiconductor layer 10 across the base region 11 to halfway above the emitter region 12.

Next, as shown in FIG. 2B, the back surface of the semiconductor layer 10 is polished. The polishing is based on e.g. chemical mechanical polishing. The thickness of the polished semiconductor layer 10 is set to e.g. 100 μm. After the back surface polishing, the back surface of the semiconductor layer 10 is wet etched 5 μm or more to remove the damage layer produced on the back surface side of the semiconductor layer 10. The semiconductor layer 10 may be e.g. a semiconductor wafer doped with n-type impurity, or an epitaxial layer doped with n-type impurity.

Figure 3A:
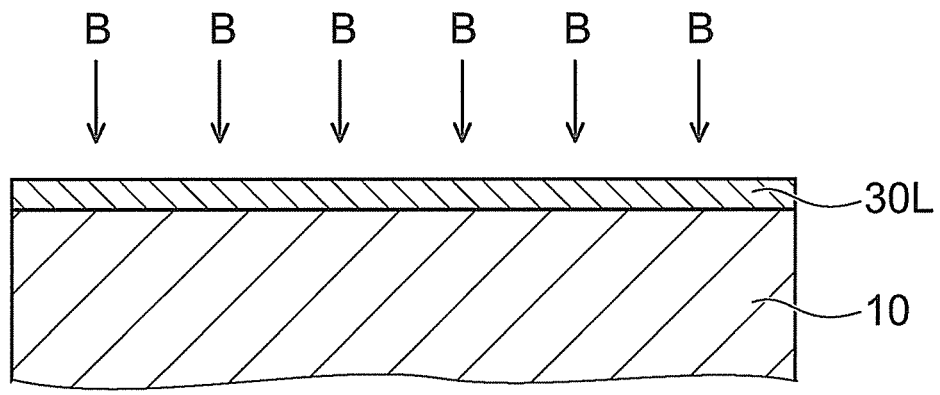
FIGS. 3A and 3B are main part sectional views illustrating processes for manufacturing the semiconductor device according to the first embodiment, where
Figure 3B:
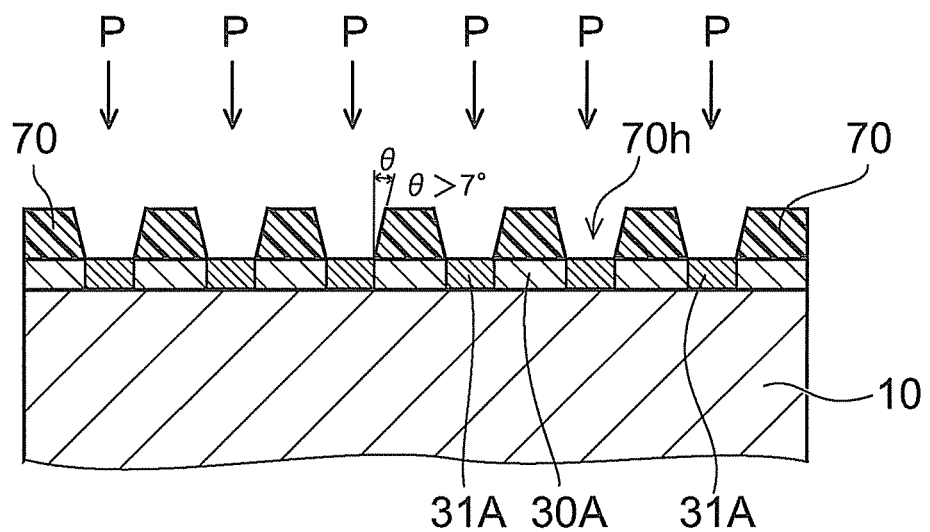

FIGS. 3A and 3B are main part sectional views illustrating the processes for manufacturing the semiconductor device according to the first embodiment. More specifically, FIG. 3A shows the process of implanting p-type impurity, and FIG. 3B shows the process of implanting n-type impurity. FIGS. 3A and 3B are depicted with the back surface of the semiconductor layer 10 facing up. In FIG. 3A and the subsequent figures, the MOS structure is not shown.

As shown in FIG. 3A, p-type impurity such as boron (B) is implanted into the entire back surface of the semiconductor layer 10. Thus, a p⁺-type impurity implantation region 30L is formed in the back surface of the semiconductor layer 10. The p-type impurity in the impurity implantation region 30L is adjusted to a prescribed concentration and a prescribed depth.

Next, as shown in FIG. 3B, a mask 70 is placed on the back surface of the semiconductor layer 10. The mask 70 includes a plurality of openings 70h opened in portions corresponding to the contact region 31. The diameter of the opening 70h is narrowed toward the back surface of the semiconductor layer 10. For instance, if the mask 70 is cut perpendicular to the back surface of the semiconductor layer 10, the side surface of the opening 70h is sloped 7° or more with respect to the normal to the back surface of the semiconductor layer 10.

The pitch and diameter of the opening 70h correspond to the pitch and diameter of the contact region 31 illustrated in FIG. 1. For instance, the pitch of the opening 70h is 300 to 400 μm. The diameter of the opening 70h is 50 to 100 μm.

Such a mask 70 is placed above the impurity implantation region 30L, and n-type impurity is implanted into the impurity implantation region 30L through the openings 70h. For instance, as shown in FIG. 3B, using the mask 70 as a blocking portion, n-type impurity such as phosphorus (P) is implanted into the back surface of the semiconductor layer 10. Hence, the n-type impurity is selectively implanted into the impurity implantation region 30L. Thus, a p⁺-type impurity implantation region 30A and an n⁺-type impurity implantation region 31A are formed in the back surface of the semiconductor layer 10. The implantation of n-type impurity is adjusted so that the n-type impurity concentration exceeds the p-type impurity concentration in the impurity implantation region 31A.

The side surface of the opening 70h is sloped 7° or more with respect to the normal to the back surface of the semiconductor layer 10. Hence, the incident angle θ (in units of degrees) of n-type impurity with respect to the normal to the major surface of the semiconductor layer 10 at which n-type impurity is implanted into the back surface of the semiconductor layer 10 through the opening 70h of the mask 70 is 7° or more. This suppresses the channeling phenomenon of ion implantation, and the projection range of impurity is controlled to a desired depth. Here, in implanting impurity, the semiconductor layer 10 and the mask 70 may be rotated in order to implant impurity more uniformly into the semiconductor layer 10. After implanting n-type impurity, the mask 70 is removed.

Figure 4:
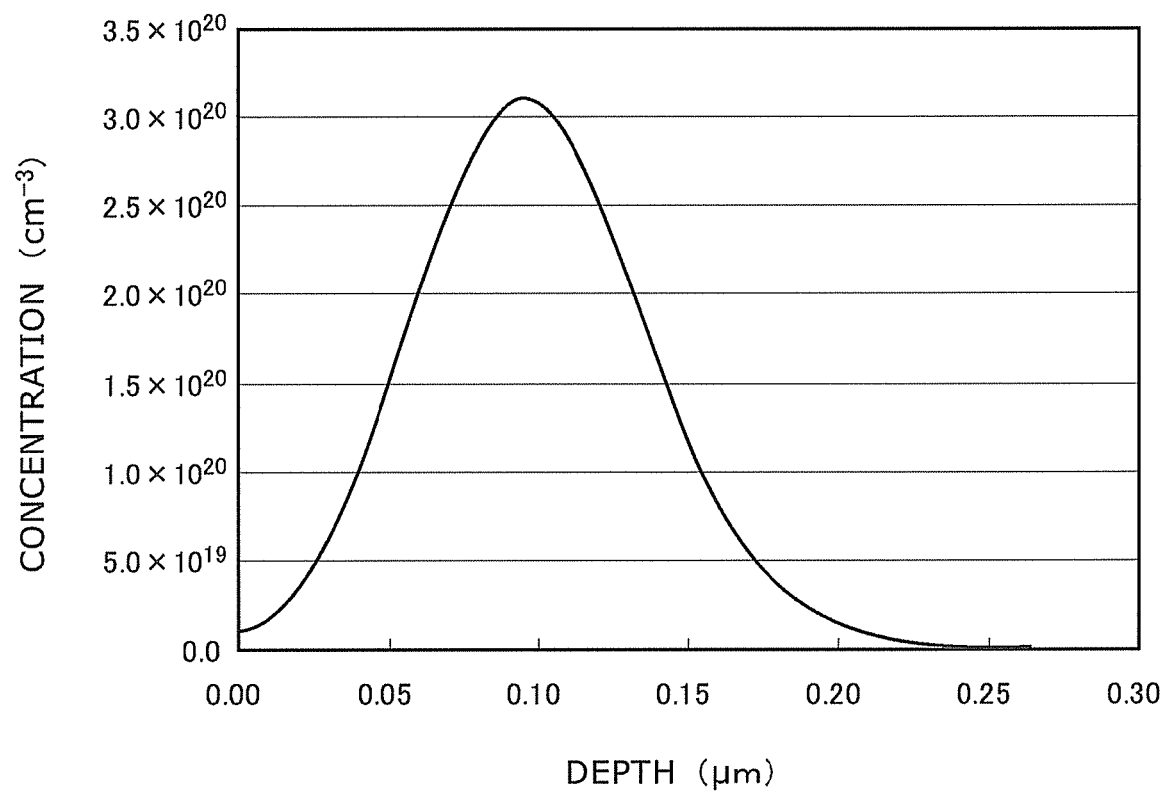
FIG. 4 is an impurity concentration profile in the depth direction of impurity implanted into an impurity implantation region.

The impurity concentration profile in the depth direction of n-type impurity implanted into the impurity implantation region 31A is shown in FIG. 4.

FIG. 4 is the impurity concentration profile in the depth direction of impurity implanted into the impurity implantation region. The horizontal axis of FIG. 4 represents the depth (distance) from the surface of the n⁺-type impurity implantation region 31A. The vertical axis of FIG. 4 represents the concentration (atoms/cm³) of n-type impurity. The n-type impurity is e.g. phosphorus (P) or arsenic (As).

As shown in FIG. 4, the impurity concentration profile has a peak around a depth of 0.1 μm. In the embodiment, the impurity concentration profile in the depth direction of the impurity implantation region 31A is adjusted so that its peak is located at a depth of 0.05 μm or more and 0.3 μm or less from the back surface of the semiconductor layer 10. The impurity concentration profile of the p⁺-type impurity implantation region 30A is adjusted likewise.

Figure 5A:
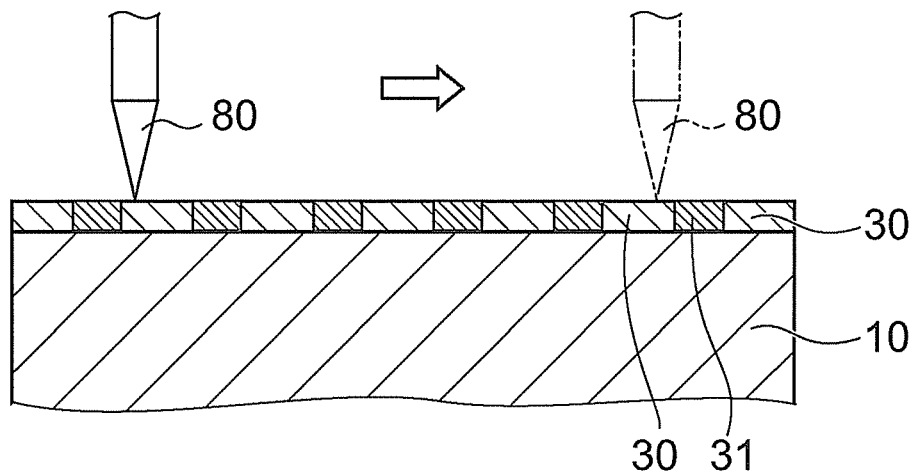
FIGS. 5A and 5B are main part sectional views illustrating processes for manufacturing the semiconductor device according to the first embodiment, where
Figure 5B:
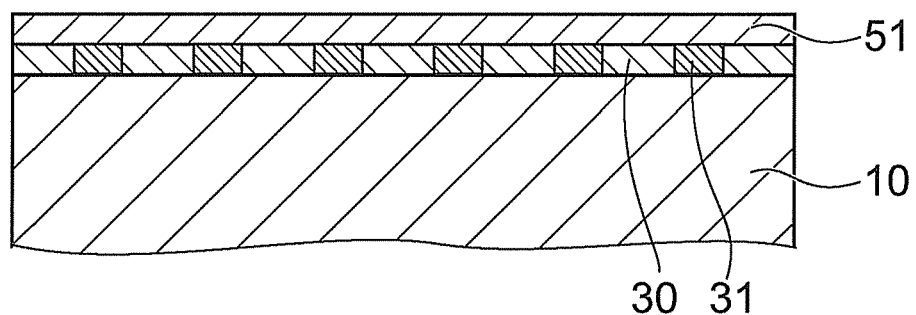

FIGS. 5A and 5B are main part sectional views illustrating the processes for manufacturing the semiconductor device according to the first embodiment. More specifically, FIG. 5A shows the laser annealing process, and FIG. 5B shows the process of forming a back surface electrode.

As shown in FIG. 5A, the back surface of the semiconductor layer 10 is irradiated with laser light 80 being slid parallel to the back surface of the semiconductor layer 10. Thus, the impurity implantation regions 30A and 31A provided in the back surface of the semiconductor layer 10 is irradiated with laser light 80. As a result, the impurity implantation regions 30A and 31A are activated by laser annealing. Thus, contact regions 30 and 31 are formed in the back surface of the semiconductor layer 10. Laser annealing is a local heating process. Hence, the back surface of the semiconductor layer 10 is locally heated. This can avoid thermal damage to the MOS structure 5 already formed on the front surface side of the semiconductor layer 10.

Next, as shown in FIG. 5B, a second main electrode 51 is formed on the entire back surface of the semiconductor layer 10. The second main electrode 51 is made of a material such as aluminum (Al) and aluminum alloy.

In the embodiment, the impurity concentration profile in the depth direction of the impurity implantation regions 30A and 31A before laser annealing is adjusted so that its peak is located at a depth of 0.05 μm or more and 0.3 μm or less from the back surface of the semiconductor layer 10.

Adjusting the peak of the impurity concentration profile to within such a range improves the contact characteristics between the contact region 30 and the second main electrode 51, and the contact characteristics between the contact region 31 and the second main electrode 51 after laser annealing.

The reason for this is described with the n-type impurity implantation region 31A taken as an example.

Figure 6A:
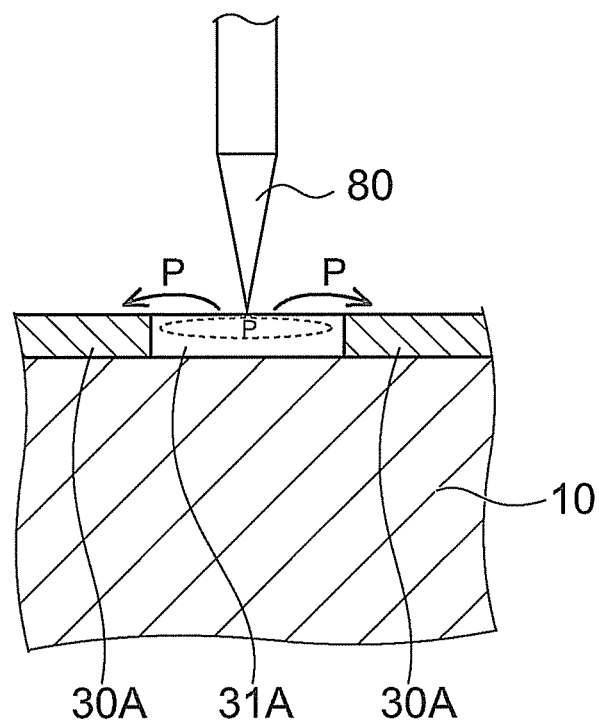
FIGS. 6A and 6B illustrate laser annealing according to a comparative example, where
Figure 6B:
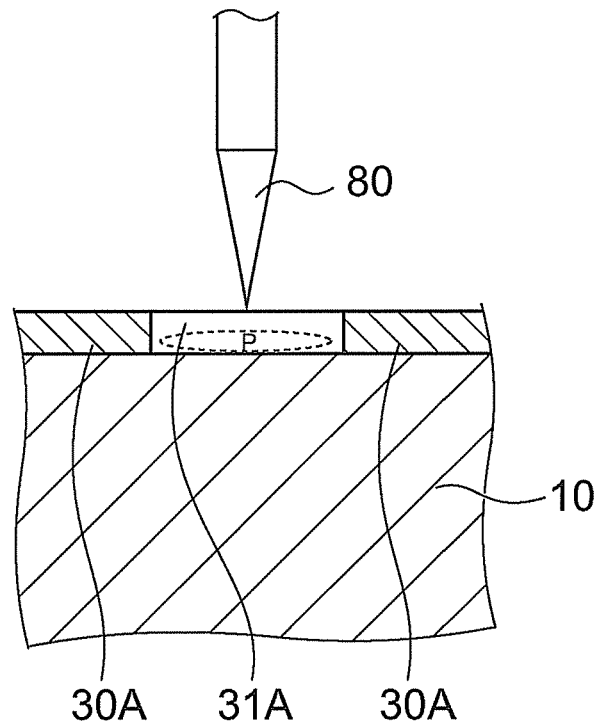

FIGS. 6A and 6B illustrate laser annealing according to a comparative example. More specifically, FIG. 6A illustrates the impurity implantation region irradiated with laser light in the case where the peak position of the impurity concentration profile of n-type impurity is less than 0.05 μm. FIG. 6B illustrates the impurity implantation region irradiated with laser light in the case where the peak position of the impurity concentration profile of n-type impurity is more than 0.3 μm.

For instance, as shown in FIG. 6A, consider the case where the peak position of the impurity concentration profile of the impurity implantation region 31A is adjusted to less than 0.05 μm. In this case, by laser annealing, n-type impurity (such as phosphorus (P) and arsenic (As)) in the impurity implantation region 31A may scatter from the impurity implantation region 31A and reach the impurity implantation region 30A adjacent to the impurity implantation region 31A. As a result, the n-type impurity is attached to the impurity implantation region 30A, and the n-type impurity in the impurity implantation region 31A itself is diluted.

Conversely, as shown in FIG. 6B, consider the case where the peak position of the impurity concentration profile of the impurity implantation region 31A is more than 0.3 μm. In this case, because the position of impurity implantation is too deep, laser annealing results in insufficient activation of impurity in the impurity implantation region 31A. As a result, the impurity concentration in the surface of the contact region 31 activated by laser annealing is diluted.

Thus, the contact characteristics between the contact region 31 and the second main electrode 51 may be impaired in the case where the peak position of the impurity concentration profile in the depth direction of the impurity implantation region 31A is smaller (shallower) than 0.05 μm from the back surface of the semiconductor layer 10, and in the case of being larger (deeper) than 0.3 μm. Such a phenomenon may also occur in the impurity implantation region 30A adjacent to the impurity implantation region 31A.

In contrast, the peak of the impurity concentration profile in the depth direction of at least one of the impurity implantation regions 30A and 31A according to the embodiment is adjusted to a depth of 0.05 μm or more and 0.3 μm or less from the back surface of the semiconductor layer 10.

Hence, even if laser annealing is performed on the impurity implantation region 31A, n-type impurity in the impurity implantation region 31A is less likely to scatter from the impurity implantation region 31A. Thus, the n-type impurity is not attached to the impurity implantation region 30A adjacent to the impurity implantation region 31A. Furthermore, the n-type impurity in the impurity implantation region 31A itself is not diluted. Furthermore, laser annealing performed on the impurity implantation region 31A does not end up with insufficient activation of the impurity implantation region 31A. Consequently, the contact characteristics between the contact region 31 and the second main electrode 51 are improved.

Furthermore, even if laser annealing is performed on the impurity implantation region 30A, p-type impurity in the impurity implantation region 30A is less likely to scatter from the impurity implantation region 30A. Thus, the p-type impurity is not attached to the impurity implantation region 31A adjacent to the impurity implantation region 30A. Furthermore, the p-type impurity in the impurity implantation region 30A itself is not diluted. Furthermore, laser annealing performed on the impurity implantation region 30A does not end up with insufficient activation of the impurity implantation region 30A. Consequently, the contact characteristics between the contact region 30 and the second main electrode 51 are improved.

Thus, the peak position of the impurity concentration profile in the depth direction of at least one of the impurity implantation regions 30A and 31A before laser annealing is preferably set to a depth of 0.05 μm or more and 0.3 μm or less from the back surface of the semiconductor layer 10.

In order to confirm the necessity to adjust the peak of the impurity concentration profile in the impurity implantation region to 0.05 μm or more and 0.3 μm or less, the inventors conducted several confirmation experiments taking implantation of n-type impurity into the semiconductor layer 10 as an example. The result of these experiments is described below.

Figure 7A:
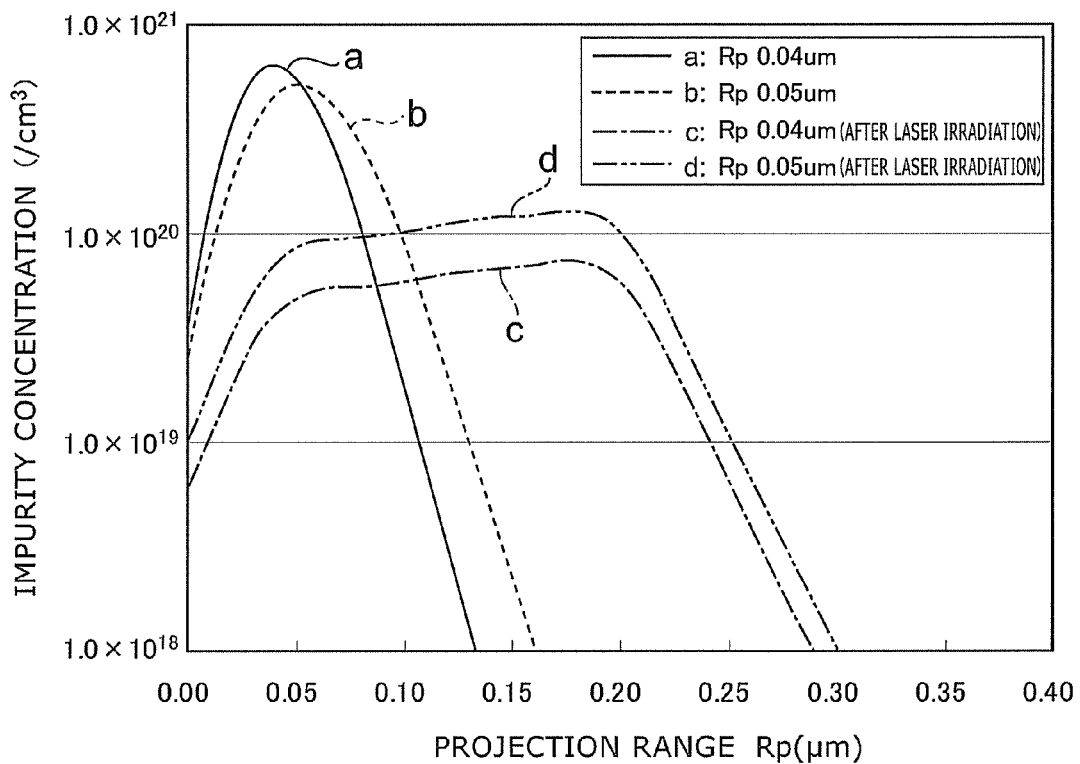
FIGS. 7A and 7B illustrate the effect of laser annealing, where
Figure 7B:
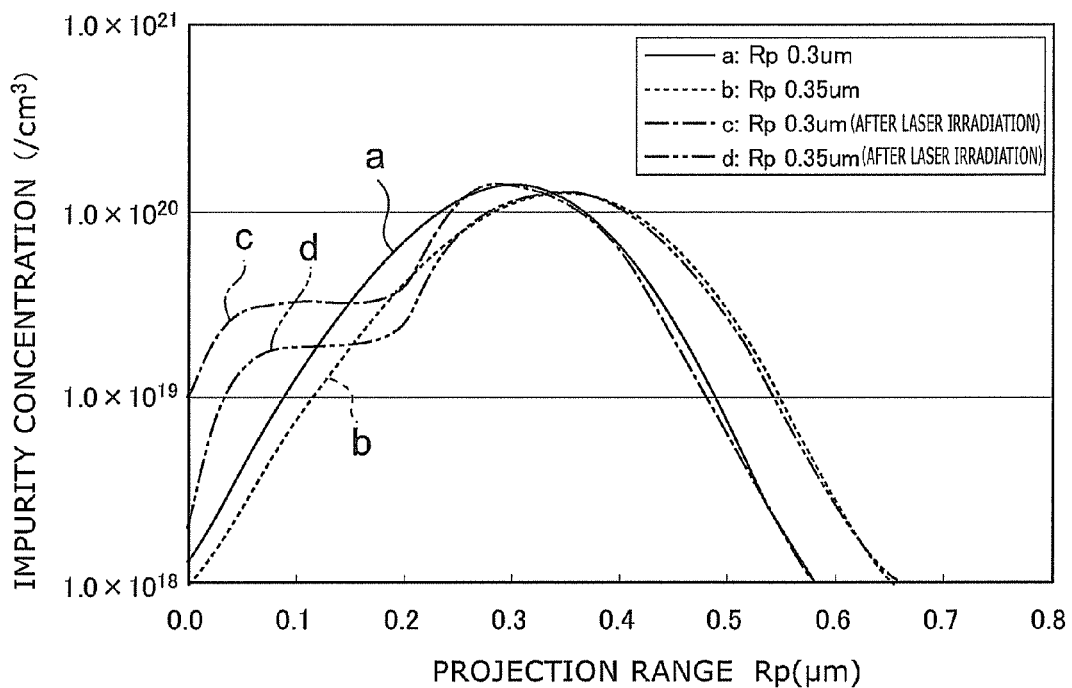

FIGS. 7A and 7B illustrate the effect of laser annealing. More specifically, FIG. 7A illustrates the effect of laser annealing in the case where the peak position of the impurity concentration profile of n-type impurity is 0.04 to 0.05 μm. FIG. 7B illustrates the effect of laser annealing in the case where the peak position of the impurity concentration profile of n-type impurity is 0.30 to 0.35 μm.

In FIGS. 7A and 7B, the horizontal axis represents the projection range Rp (μm) of impurity from the back surface of the semiconductor layer 10, and the vertical axis represents impurity concentration (/cm$^3$).

Here, in FIGS. 7A and 7B, line a is the impurity concentration profile of phosphorus (P) in the impurity implantation region 31A before laser annealing. Line b is the impurity concentration profile of arsenic (As) in the impurity implantation region 31A before laser annealing. Line c is the impurity concentration profile of phosphorus (P) in the contact region 31 after laser annealing. Line d is the impurity concentration profile of arsenic (As) in the contact region 31 after laser annealing.

FIG. 7A shows the case where the peak position of the impurity concentration profile of n-type impurity is 0.04 to 0.05 μm. As seen in FIG. 7A, if laser annealing is performed on the impurity implantation region 31A, the peak of the impurity concentration profile is flattened in the range of 0.04 to 0.2 μm. That is, the depth of melting the semiconductor layer 10 by laser irradiation is approximately 0.2 μm from the back surface of the semiconductor layer 10. The n-type impurity around the peak is diffused by melting of the semiconductor layer 10. In this case, it was confirmed that n-type impurity (phosphorus (P), arsenic (As)) in the impurity implantation region 31A scattered from the impurity implantation region 31A to the adjacent impurity implantation region 30A.

FIG. 7B shows the case where the peak position of the impurity concentration profile of n-type impurity is 0.30 to 0.35 μm. As seen in FIG. 7B, the impurity concentration profile is varied in the depth range of 0.0 to 0.2 μm before and after laser annealing, but is left substantially unchanged above 0.2 μm. The reason for this is considered as follows. The depth of melting the semiconductor layer 10 by laser irradiation is approximately 0.2 μm. Hence, if the peak position of the impurity concentration profile is greater than 0.3 μm, impurity diffusion by laser annealing is made less likely to occur. Thus, the peak position of the impurity concentration profile of n-type impurity is preferably adjusted to 0.3 μm or less.

Figure 8A:
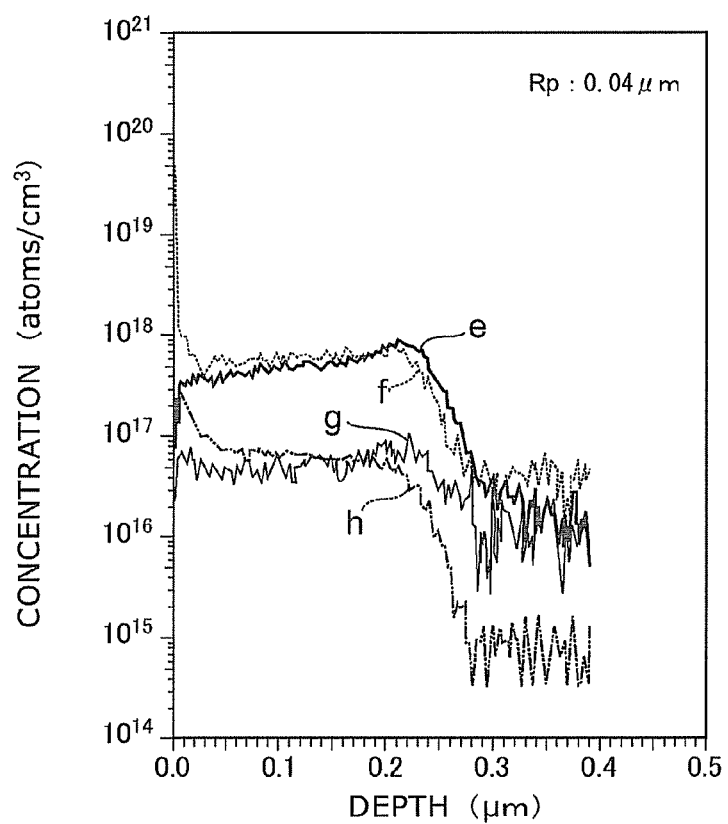
FIGS. 8A and 8B illustrate the effect of laser annealing, where
Figure 8B:
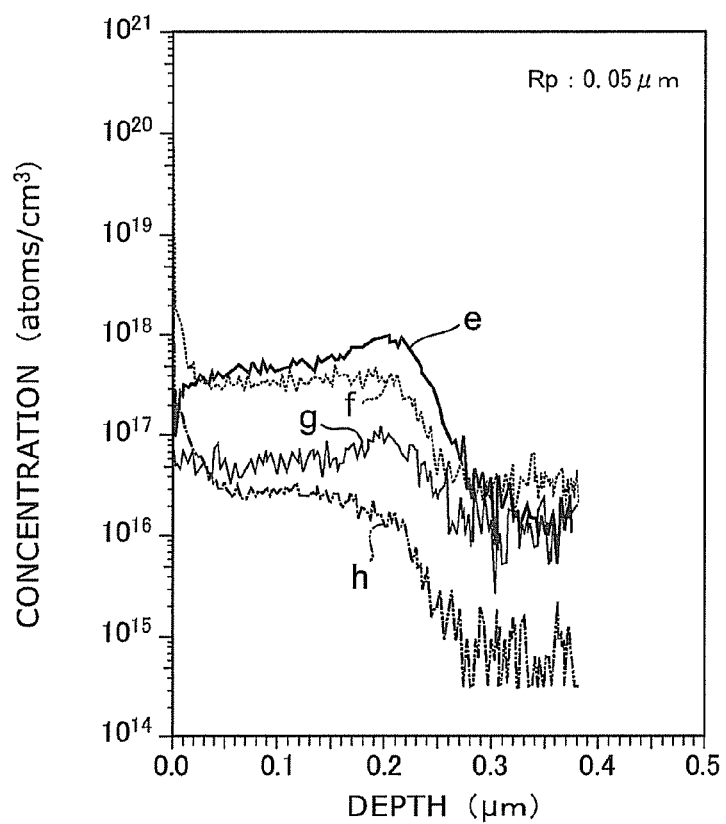

FIGS. 8A and 8B illustrate the effect of laser annealing. More specifically, FIG. 8A illustrates the effect of laser annealing in the case where the peak position of the impurity concentration profile of n-type impurity is 0.04 μm. FIG. 8B illustrates the effect of laser annealing in the case where the peak position of the impurity concentration profile of n-type impurity is 0.05 μm.

FIGS. 8A and 8B show SIMS (secondary ion mass spectrometry) results in the depth direction of the $p^+$-type contact region 30 after laser annealing.

Here, line e is the SIMS result in the depth direction of boron (B (mass 11)) in the contact region 30 after laser annealing. Line f is the SIMS result in the depth direction of phosphorus (P) in the contact region 30 after laser annealing. Line g is the SIMS result in the depth direction of boron (B (mass 10)) in the contact region 30 after laser annealing. Line h is the SIMS result in the depth direction of arsenic (As) in the contact region 30 after laser annealing.

In FIG. 8A, boron (B (mass 10, 11)) is observed at a depth of 0.0 to 0.3 μm. This is the p-type impurity implanted into the contact region 30. However, in FIG. 8A, n-type impurity of phosphorus (P) at high concentration is observed at a depth of 0.0 to 0.2 μm. This concentration of phosphorus (P) is observed to be higher than the concentration of boron (B (mass 11)). The reason for this is considered as follows. By laser irradiation, n-type impurity (phosphorus (P)) in the impurity implantation region 31A has scattered from the impurity implantation region 31A to the adjacent impurity implantation region 30A.

However, as seen in FIG. 8B, if the peak position of the impurity concentration profile of n-type impurity is 0.05 μm, the concentration of n-type impurity, or phosphorus (P), is lower than the concentration of boron (B (mass 11)) at a depth of 0.0 to 0.2 μm. The reason for this is considered as follows. If the peak position of the impurity concentration profile of n-type impurity is 0.05 μm or more, n-type impurity (phosphorus (P)) is less likely to scatter from the impurity implantation region 31A even if the impurity implantation region 31A is subjected to laser irradiation. Hence, the peak position of the impurity concentration profile of n-type impurity is preferably adjusted to 0.05 μm or more.

Thus, the peak position of the impurity concentration profile of n-type impurity in the impurity implantation region 31A is preferably adjusted to 0.05 μm or more and 0.3 μm or less. Likewise, the peak position of the impurity concentration profile of p-type impurity in the impurity implantation region 30A is preferably adjusted to 0.05 μm or more and 0.3 μm or less.

Next, the structure of the mask used in the processes for manufacturing the semiconductor device is described in detail.

Figure 9A:
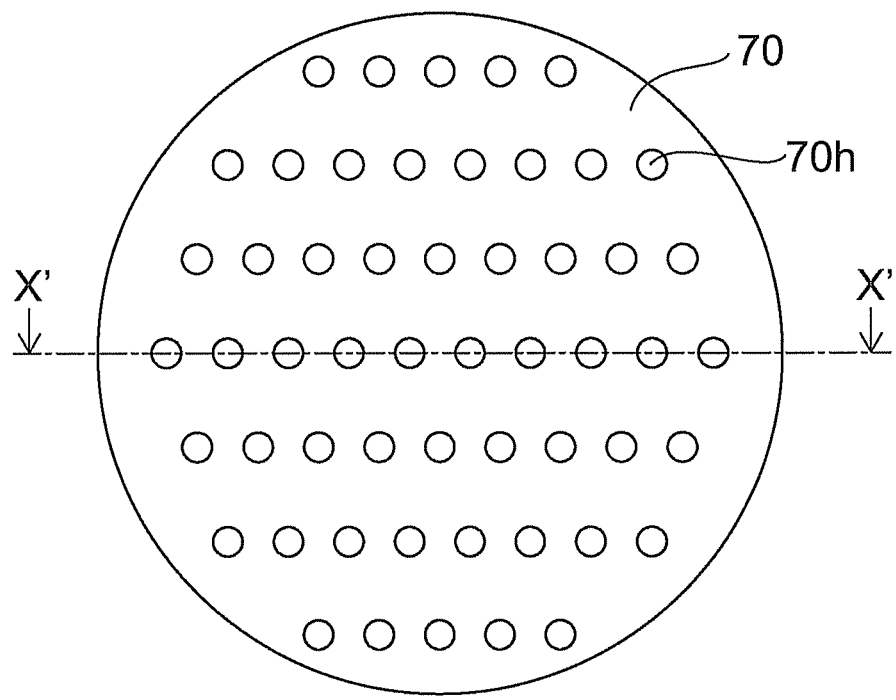
FIGS. 9A and 9B are main part views illustrating the structure of a first mask, where
Figure 9B:
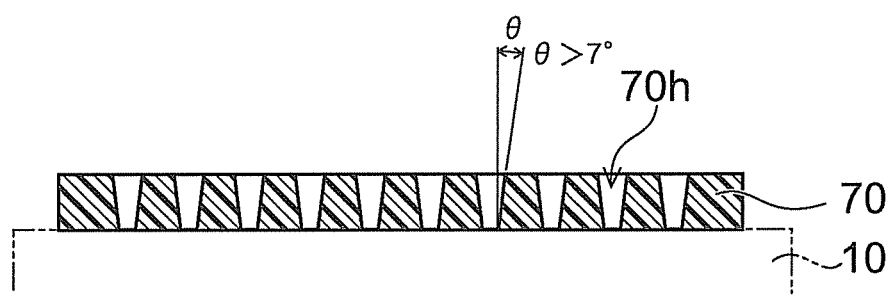

FIGS. 9A and 9B are main part views illustrating the structure of a first mask. More specifically, FIG. 9A is a schematic plan view of the first mask, and FIG. 9B is a schematic sectional view taken along X-X' of FIG. 9A.

The first mask 70 is the mask already described with reference to FIG. 3B. The first mask 70 includes a plurality of openings 70h. The diameter of the opening 70h is narrowed toward the back surface of the semiconductor layer 10. For instance, in the cross section of the mask 70, the side surface of the opening 70h is sloped 7° or more with respect to the normal to the back surface of the semiconductor layer 10.

In the case where the thickness of the semiconductor layer 10 is 200 μm or less, the semiconductor layer 10 itself may warp. In such cases, the mask 70 is used to press the semiconductor layer 10 during ion implantation. This suppresses warping of the semiconductor layer 10 in the ion implantation process, and the contact region 31 is made less prone to pattern distortion.

Figure 10A:
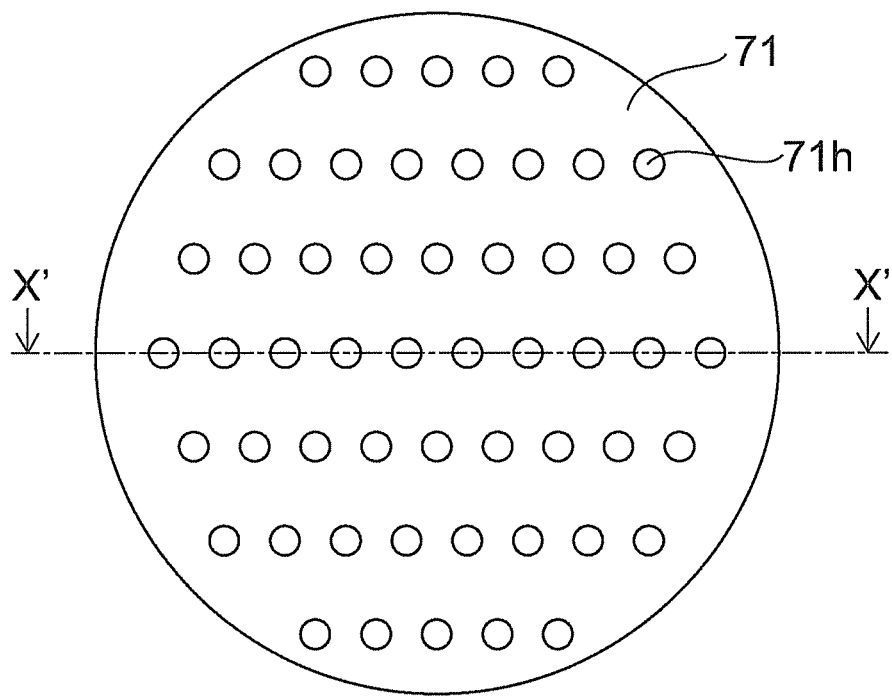
FIGS. 10A and 10B are main part views illustrating the structure of a second mask, where
Figure 10B:
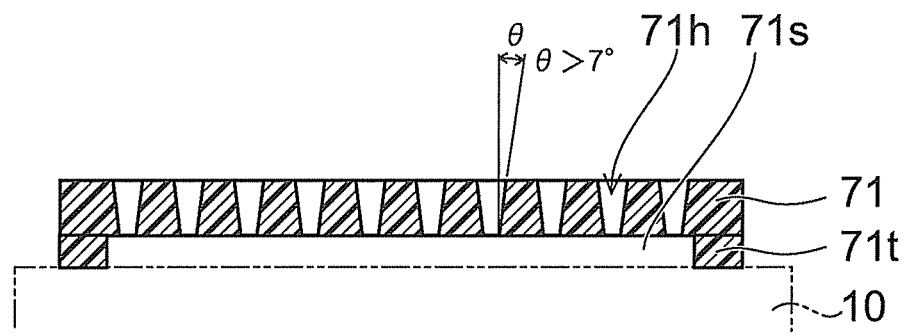

FIGS. 10A and 10B are main part views illustrating the structure of a second mask. More specifically, FIG. 10A is a schematic plan view of the second mask, and FIG. 10B is a schematic sectional view taken along X-X' of FIG. 10A.

In the case where the semiconductor layer 10 is not warped, the second mask 71 is used.

The mask 71 includes a plurality of openings 71h. The diameter of the opening 71h is narrowed toward the back surface of the semiconductor layer 10. For instance, in the cross section of the mask 71, the side surface of the opening 71h is sloped 7° or more with respect to the normal to the back surface of the semiconductor layer 10. At the periphery of the mask 71, a protrusion 71t is provided. The width of the protrusion 71t is 2 to 3 mm. By bringing the protrusion 71t into contact with the outer periphery of the semiconductor layer 10, a space 70s is formed between the back surface of the semiconductor layer 10 and the mask 71. The thickness of the space 70s is e.g. 50 to 100 μm. Thus, the back surface of the semiconductor layer 10 is not in direct contact with the mask 71. This can avoid damage to the region for forming the contact regions 30 and 31. Here, a resist may be used as an adhesive between the protrusion 71t and the semiconductor layer 10.

Figure 11A:
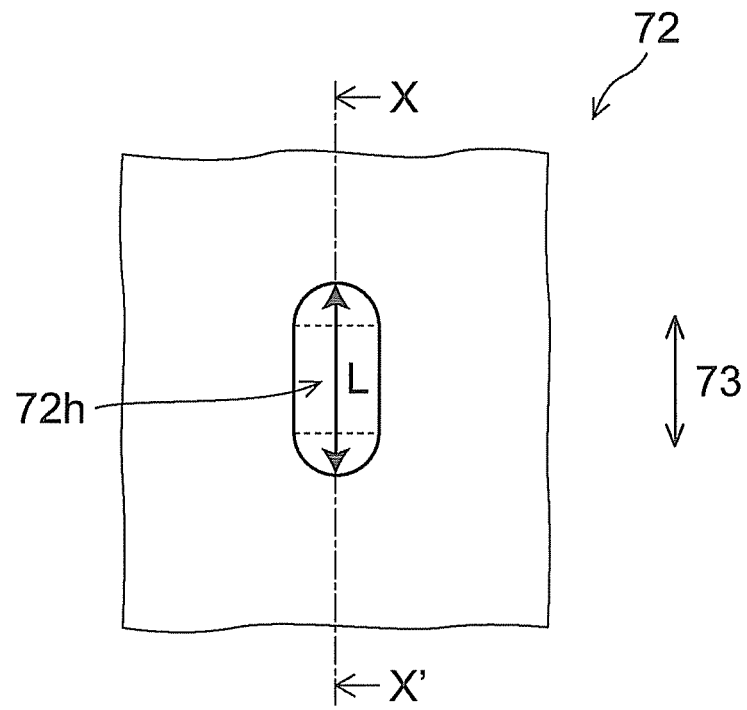
FIGS. 11A and 11B are main part views illustrating the structure of a third mask, where
Figure 11B:
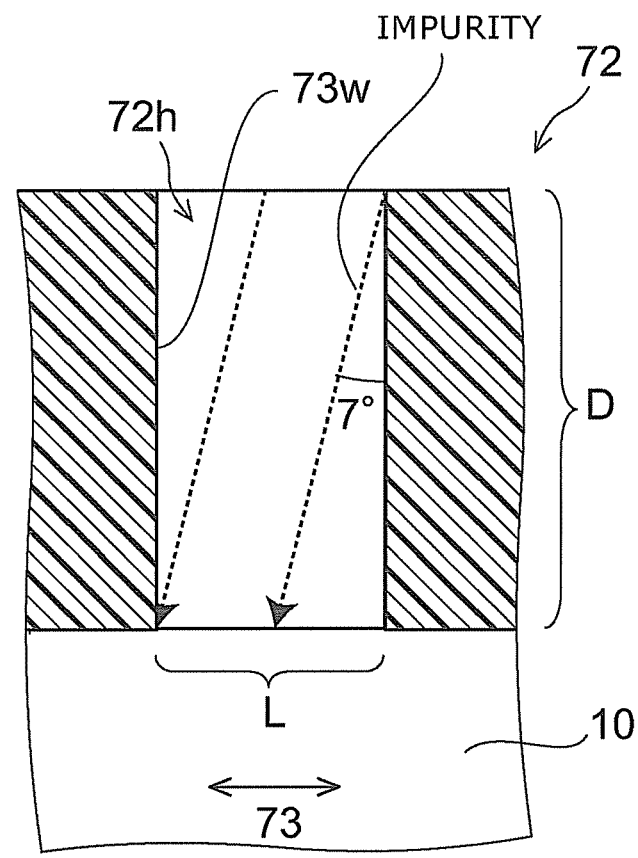

FIGS. 11A and 11B are main part views illustrating the structure of a third mask. More specifically, FIG. 11A is a schematic plan view of the third mask, and FIG. 11B is a schematic sectional view taken along X-X' of FIG. 11A. FIGS. 11A and 11B show the opening provided in the mask in enlarged view.

As shown in FIG. 11A, as viewed in the direction perpendicular to the plane of the mask 72, the opening 72h provided in the mask 72 forms an oblong circle (e.g., a shape in which semicircles are added to both ends of a rectangle). The longitudinal direction of this oblong circle is indicated by arrow 73 in the figure. Furthermore, as shown in FIG. 11B, the thickness D of the mask 72 and the longitudinal length L of the opening 72h are designed so as to satisfy θ>7° where tan θ=(length L)/(thickness D).

Impurity implantation into the semiconductor layer 10 may be performed with the impurity beam twisted in a prescribed direction. In the embodiment, impurity is implanted into the back surface of the semiconductor layer 10 with the impurity beam twisted in the longitudinal direction (the direction of arrow 73 in the figure) of the opening 72h.

In such a mask 72, the incident angle of impurity injected into the semiconductor layer 10 generally parallel to the longitudinal direction (the direction of arrow 73 in the figure) of the opening 72h is 7° or more. For instance, impurity injected with an incident angle of 7° reliably reaches the back surface of the semiconductor layer 10 without colliding with the inner wall 73w of the opening 72h.

The thickness of the mask 70, 71, 72 is set to e.g. 200 μm or more in order to achieve a prescribed mechanical strength. The material of the mask 70, 71, 72 is e.g. silicon (Si). The openings 70h, 71h, 72h are formed by sand blasting and reactive etching. If the thickness of the mask is thick such as 300 μm or more, sand blasting and reactive etching may be performed on both sides. The mask 70, 71, 72 is detachable from the ion implantation apparatus, achieving high exchangeability on the occasion of cleaning, for instance.

Furthermore, by using the mask 70, 71, 72, the need for the photolithography process is eliminated in the process of selective implantation of impurity. That is, each time the impurity implantation regions 30A and 31A are selectively formed, the process of patterning the mask material by photolithography (e.g., PEP (photolithography etching process)) can be omitted. This simplifies the manufacturing processes and reduces the manufacturing cost.

Furthermore, in the embodiment, after the MOS structure 5 is formed on the front surface side of the semiconductor layer 10, the back surface of the semiconductor layer 10 is polished to form impurity implantation regions 30A, 31A. Thus, in the process for manufacturing the MOS structure 5, the semiconductor layer 10 keeps a certain thickness. Hence, even if the process for manufacturing the MOS structure 5 is performed, defects and cracks are less likely to occur in the semiconductor layer 10.

Furthermore, in the embodiment, after the MOS structure 5 is formed on the front surface side of the semiconductor layer 10, the back surface of the semiconductor layer 10 is polished. Hence, the thickness of the semiconductor layer 10 does not change during the process for manufacturing the MOS structure 5. Thus, dedicated manufacturing systems for different thicknesses of the semiconductor layer 10 are not required in the process for manufacturing the MOS structure 5. This reduces the manufacturing cost.

Furthermore, in the semiconductor device 1, the peak position of the impurity concentration profile of p-type impurity is adjusted to 0.05 μm or more and 0.3 μm or less. Hence, the thickness of the $p^+$-type contact region 30 activated by laser annealing can be controlled in the range of 0.2 to 1.0 μm. Thus, in the semiconductor device 1, the amount of holes injected from the contact region 30 into the semiconductor layer 10 can be properly controlled. For instance, if the thickness of the $p^+$-type contact region 30 is 50 μm or more, even when the IGBT in the semiconductor device 1 is switched from the ON state to the OFF state, holes may be injected from the contact region 30 into the semiconductor layer 10. Hole injection after switching from the ON state to the OFF state is undesirable, because it is an unnecessary heat generation source for the semiconductor device 1. As a method for addressing this problem, it may be contemplated to form defects in the semiconductor layer 10 to trap injected holes by these defects. In the method for manufacturing a semiconductor device according to the embodiment, there is no need to form such defects, and the manufacturing process can be simplified.

Thus, the embodiment realizes a method for manufacturing a semiconductor device enabling manufacturing at low cost without increasing the contact resistance between the back surface electrode and the semiconductor layer.

Second Embodiment

Next, a method for manufacturing a semiconductor device according to a second embodiment is described.

The method for manufacturing a semiconductor device according to the second embodiment follows the same manufacturing processes as that of FIGS. 2A to 3A described above. The description of the manufacturing processes of FIGS. 2A to 3A is omitted.

Figure 12A:
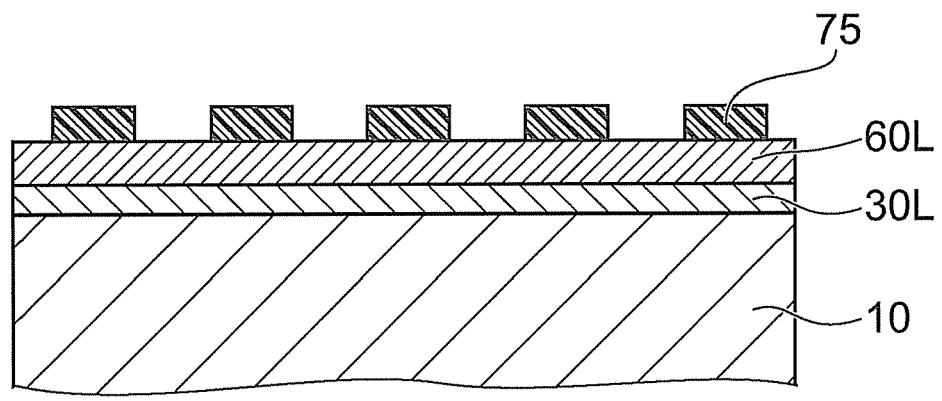
FIGS. 12A and 12B are main part sectional views illustrating processes for manufacturing a semiconductor device according to a second embodiment, where
Figure 12B:
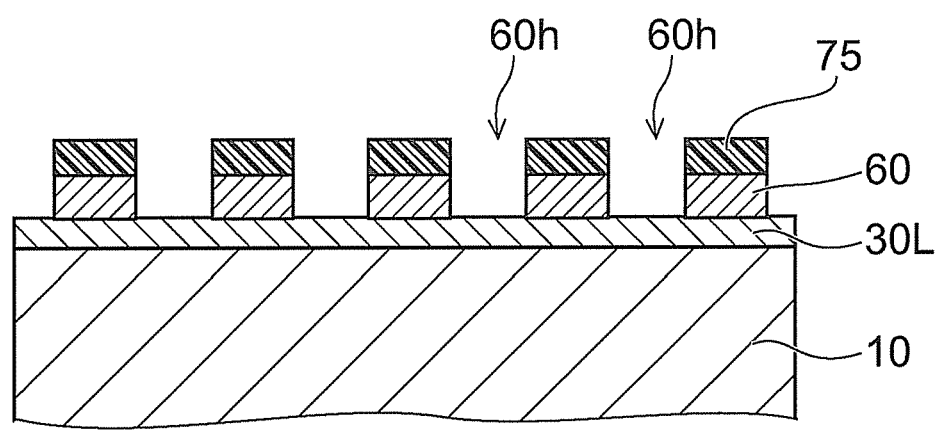

FIGS. 12A and 12B are main part sectional views illustrating the processes for manufacturing the semiconductor device according to the second embodiment. More specifically, FIG. 12A shows the process of forming an SOG film, and FIG. 12B shows the process of processing the SOG film.

As shown in FIG. 12A, an SOG (spin on glass) film 60L is formed above the $p^+$-type impurity implantation region 30L provided in the back surface of the semiconductor layer 10. The SOG film 60L is primarily composed of silicon oxide (SiOx).

The SOG film 60L is formed as follows, for instance. A paste of silanol ($Si(OH)_4$) dissolved in alcohol is applied onto the impurity implantation region 30L by spin coating. Then, alcohol is evaporated by heat treatment, and silanol is dehydropolymerized into an SOG film 60L.

Subsequently, a mask 75 is formed above the SOG film 60L. The mask 75 is a resist patterned by photolithography.

Next, as shown in FIG. 12B, the SOG film 60L is etched. For instance, using the mask 75 as a blocking film, the SOG film 60L is etched with a dilute hydrofluoric acid solution.

Thus, a patterned SOG film 60 is formed. Part of the impurity implantation region 30L is exposed in the opening 60h of the SOG film 60. The position and width of the opening 60h correspond to the position and width of the contact region 31. After the SOG film 60 is patterned, the mask 75 is removed by ashing.

Figure 13A:
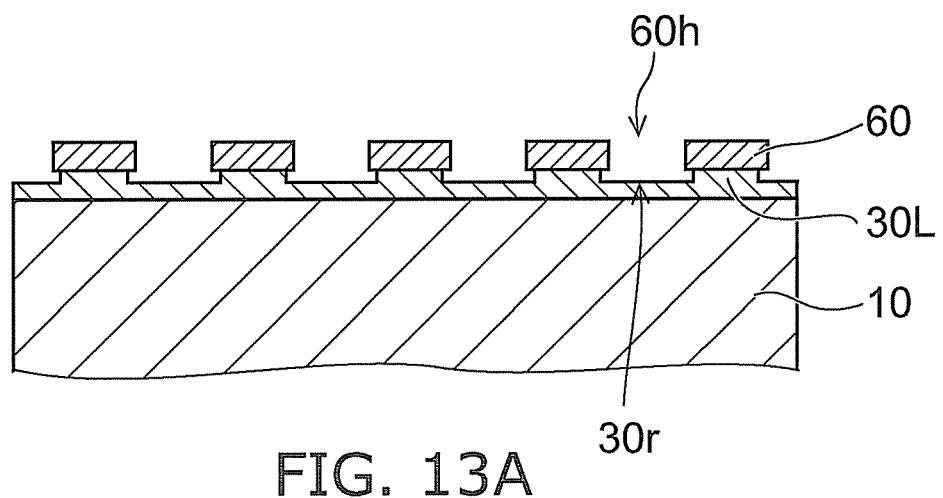
FIGS. 13A and 13B are main part sectional views illustrating processes for manufacturing the semiconductor device according to the second embodiment, where
Figure 13B:
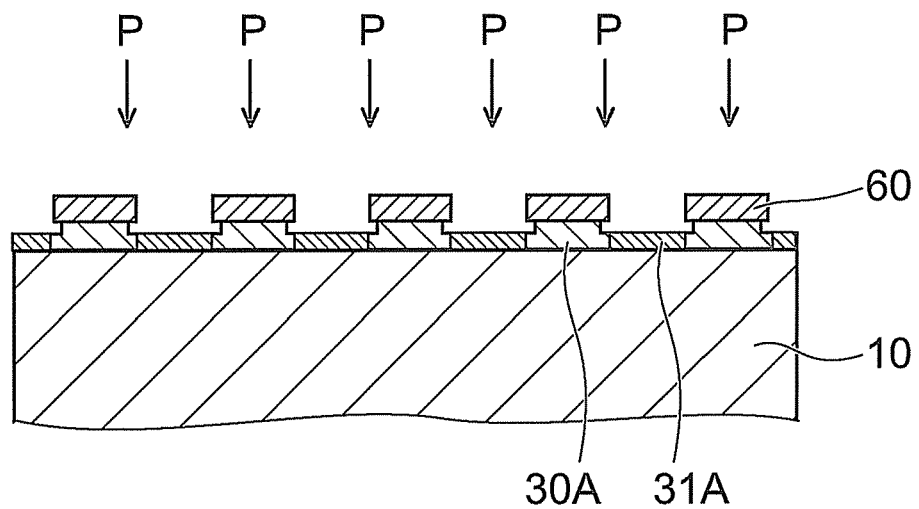

FIGS. 13A and 13B are main part sectional views illustrating the processes for manufacturing the semiconductor device according to the second embodiment. More specifically, FIG. 13A shows the process of etching the impurity implantation region, and FIG. 13B shows the process of implanting n-type impurity.

As shown in FIG. 13A, using the SOG film 60 as a mask, chemical dry etching is performed on the impurity implantation region 30L. By chemical dry etching, the impurity implantation region 30L is removed approximately 0.1 μm thick from the surface of the impurity implantation region 30L. By this chemical dry etching, the lower side of the end portion of the SOG film 60 is overetched. Hence, the width of the recess region 30r provided in the impurity implantation region 30L is made wider than the width of the opening 60h of the SOG film 60. Thus, the surface of the impurity implantation region 30L exposed in the opening 60h and the surface of the impurity implantation region 30L below the end portion of the SOG film 60 are etched.

Next, as shown in FIG. 13B, using the SOG film 60 as a blocking portion, n-type impurity such as phosphorus (P) is implanted into the back surface of the semiconductor layer 10. That is, the SOG film 60 is placed on the portion corresponding to the contact region 30, and n-type impurity is implanted into the impurity implantation region 30L through the opening 60h. Thus, as shown in FIG. 13B, impurity implantation regions 30A and 31A are formed in the back surface of the semiconductor layer 10. The implantation of n-type impurity is adjusted so that the n-type impurity concentration exceeds the p-type impurity concentration in the impurity implantation region 31A. However, the n-type impurity concentration may be made lower than in the impurity concentration in the first embodiment, because the thickness of the impurity implantation region 30L is thinned by etching.

Figure 14A:
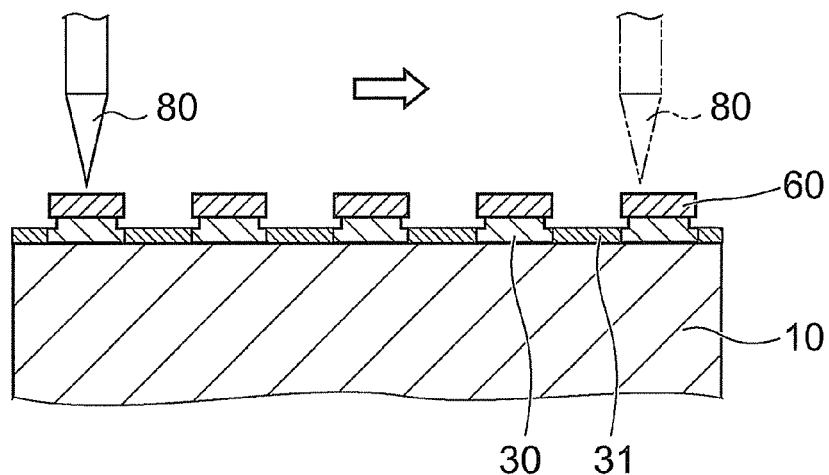
FIGS. 14A to 14C are main part sectional views illustrating processes for manufacturing the semiconductor device according to the second embodiment, where
Figure 14B:
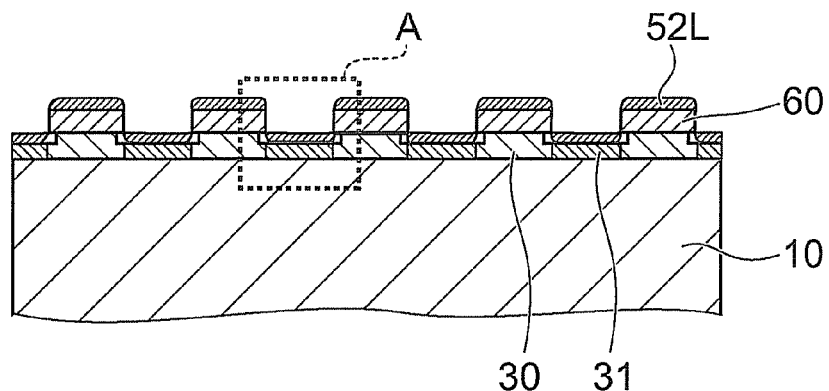
Figure 14C:
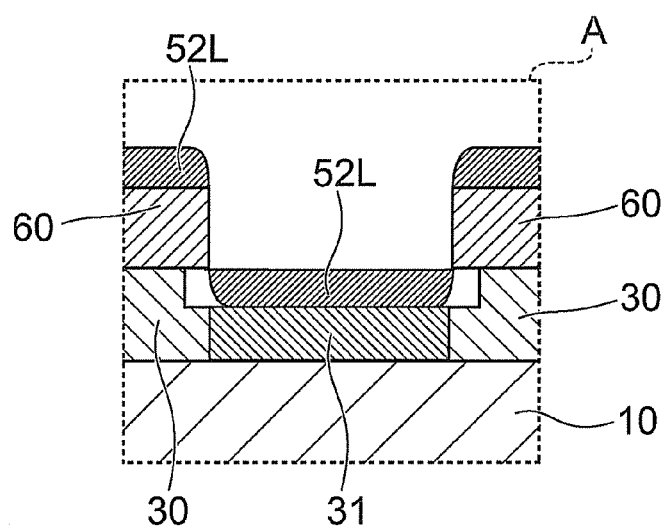

FIGS. 14A to 14C are main part sectional views illustrating the processes for manufacturing the semiconductor device according to the second embodiment. More specifically, FIG. 14A shows the laser annealing process, FIG. 14B shows the process of forming a metal film, and FIG. 14C is a partially enlarged view of FIG. 14B.

As shown in FIG. 14A, the upper side of the SOG film 60, and the semiconductor layer 10 exposed from the SOG film 60 are irradiated with laser light 80.

Here, the peak position of the impurity concentration profile of p-type impurity in the impurity implantation region 30A before irradiation with laser light 80 is adjusted to 0.05 μm or more and 0.3 μm or less. Furthermore, the peak position of the impurity concentration profile of n-type impurity in the impurity implantation region 31A before irradiation with laser light 80 is adjusted to 0.05 μm or more and 0.3 μm or less.

Because the SOG film 60 is primarily composed of silicon oxide (SiOx), the laser light 80 is transmitted through the SOG film 60. Hence, by sliding the laser light 80 parallel to the back surface of the semiconductor layer 10, both the impurity implantation regions 30A and 31A can be irradiated with the laser light 80. In other words, the upper side of the impurity implantation region 30A is covered with the SOG film 60 serving as a blocking portion, and the impurity implantation region 31A is not covered with the SOG film 60. In this state, the impurity implantation region 31A is irradiated with the laser light 80 through the SOG film 60, and the impurity implantation region 30A is also irradiated with the laser light 80.

Accordingly, the impurity implantation regions 30A and 31A are activated by laser annealing. Thus, as shown in FIG. 14A, contact regions 30 and 31 are formed in the back surface of the semiconductor layer 10. During laser annealing, the impurity implantation region 30A is covered with the SOG film 60. Hence, even if n-type impurity is scattered from the impurity implantation region 31A by laser irradiation, the scattered n-type impurity does not attach to the impurity implantation region 30A.

Next, as shown in FIG. 14B, a metal film 52L made of e.g. titanium (Ti) is formed above the SOG film 60 and above the contact region 31. The metal film 52L is formed by e.g. sputtering. The metal film 52L is made of a material such as titanium (Ti), vanadium (V), and nickel (Ni). Thus, the metal film 52L is formed on the surface of the contact region 31 exposed in the opening 60h of the SOG film 60 serving as a mask. As shown in FIG. 14C, the metal film 52L is configured so as not to extend to below the end portion of the SOG film 60.

Figure 15A:
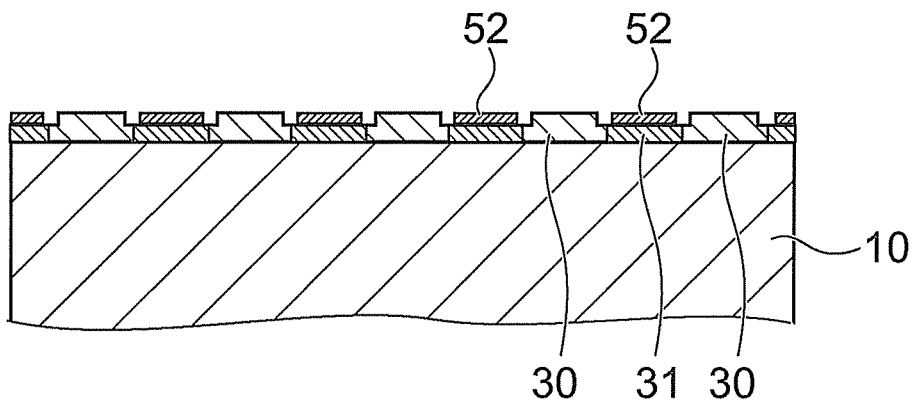
FIGS. 15A and 15B are main part sectional views illustrating processes for manufacturing the semiconductor device according to the second embodiment, where
Figure 15B:
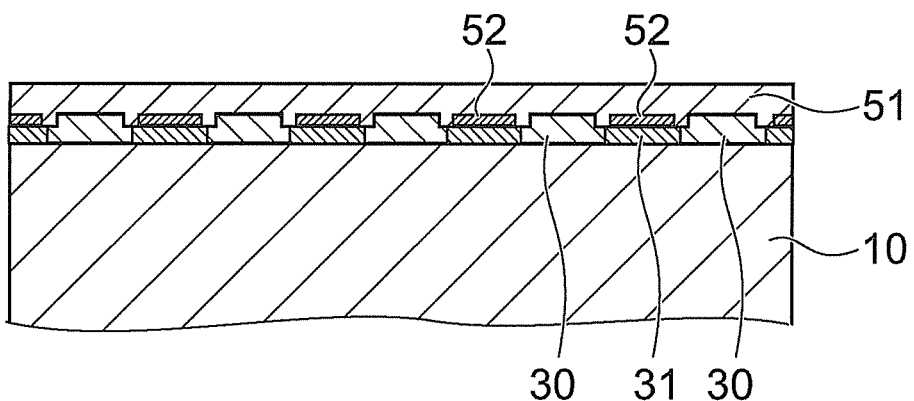

FIGS. 15A and 15B are main part sectional views illustrating the processes for manufacturing the semiconductor device according to the second embodiment. More specifically, FIG. 15A shows the lift-off process for the SOG film, and FIG. 15B shows the process of forming a metal film.

As shown in FIG. 15A, the SOG film 60 is removed by lift-off. For instance, the SOG film 60 is removed by etching with a dilute hydrofluoric acid solution. By lift-off, the metal film 52 formed on the SOG film 60 is also removed. Thus, the metal film 52 is selectively formed above the contact region 31.

Next, shown in FIG. 15B, a second main electrode 51 made of e.g. aluminum (Al) is formed on the back surface side of the semiconductor layer 10. The second main electrode 51 is formed above the contact region 30 and above the metal film 52 provided on the surface of the contact region 31.

The second embodiment achieves effects similar to those of the first embodiment. In addition, the metal film 52 made of e.g. titanium (Ti) is provided between the second main electrode 51 and the contact region 31. Hence, the contact resistance between the second main electrode 51 and the contact region 31 can be further reduced. For instance, the dose amount of n-type impurity (e.g., phosphorus (P), arsenic (As)) of the contact region 31 may be $1 \times 10^{14}/cm^2$ to $3 \times 10^{15}/cm^2$. Even in this case, by interposing the metal film 52 between the second main electrode 51 and the contact region 31, the contact resistance between the second main electrode 51 and the contact region 31 can be reduced.

As an alternative method for improving the contact characteristics between the contact region 31 and the second main electrode 51, it may be contemplated to increase the impurity concentration of the contact region 31. In contrast, in the second embodiment, the contact resistance between the contact region 31 and the second main electrode 51 is further reduced by interposing the metal film 52 between the contact region 31 and the second main electrode 51. This can minimize the impurity concentration of the contact region 31 and reduce the manufacturing cost.

Third Embodiment

Next, a method for manufacturing a semiconductor device according to a third embodiment is described.

Figure 16A:
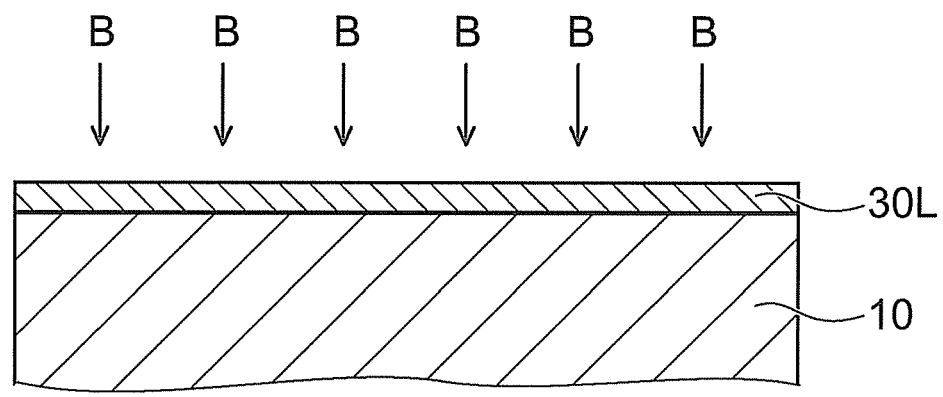
FIGS. 16A and 16B are main part sectional views illustrating processes for manufacturing a semiconductor device according to a third embodiment, where
Figure 16B:
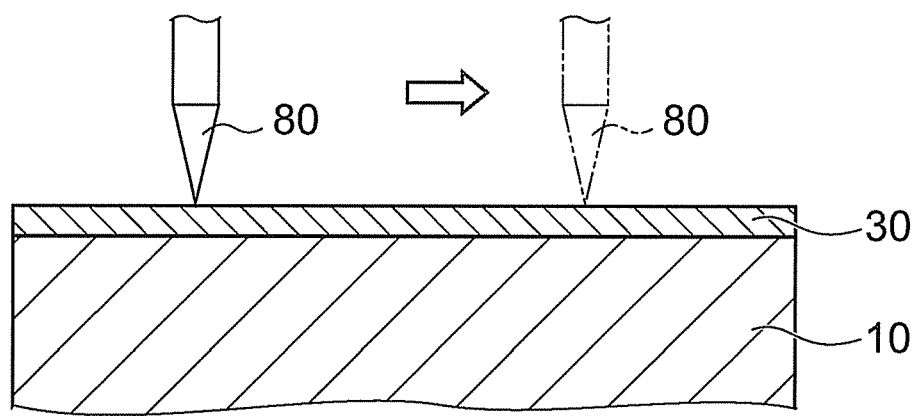

FIGS. 16A and 16B are main part sectional views illustrating the processes for manufacturing the semiconductor device according to the third embodiment. More specifically, FIG. 16A shows the process of implanting p-type impurity, and FIG. 16B shows the laser annealing process. FIGS. 16A and 16B are depicted with the back surface of the semiconductor layer 10 facing up, while a MOS structure is provided on the front surface side of the semiconductor layer 10.

As shown in FIG. 16A, p-type impurity such as boron (B) is implanted into the entire back surface of the semiconductor layer 10. Thus, a $p^+$-type impurity implantation region 30L is formed in the back surface of the semiconductor layer 10. The p-type impurity in the impurity implantation region 30L is adjusted to a prescribed concentration and a prescribed depth. For instance, the peak position of the impurity concentration profile of p-type impurity is adjusted to 0.05 μm or more and 0.3 μm or less.

Next, as shown in FIG. 16B, the semiconductor layer 10 is irradiated with laser light 80 being slid parallel to the back surface of the semiconductor layer 10.

Hence, the impurity implantation region 30L is activated by laser annealing. Thus, an unprocessed contact region 30 is formed as shown in FIG. 16B.

Figure 17A:
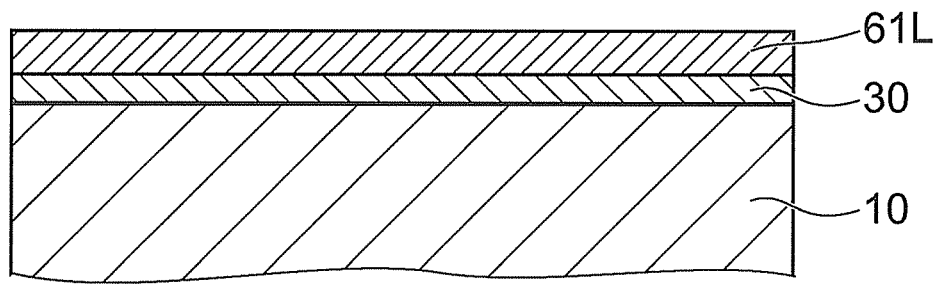
FIGS. 17A and 17B are main part sectional views illustrating processes for manufacturing the semiconductor device according to the third embodiment, where
Figure 17B:
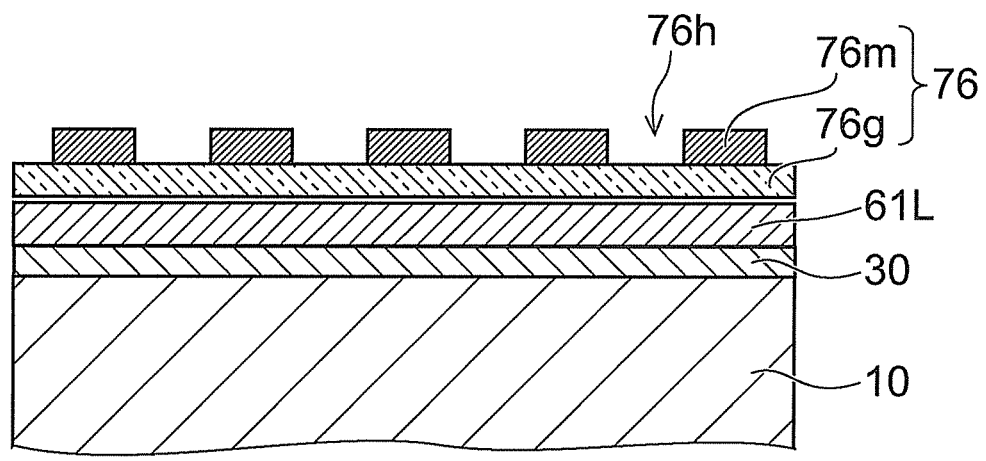

FIGS. 17A and 17B are main part sectional views illustrating the processes for manufacturing the semiconductor device according to the third embodiment. More specifically, FIG. 17A shows the process of forming an SOG film, and FIG. 17B shows the process of placing a mask.

As shown in FIG. 17A, an SOG film 61L is formed by spin coating above the $p^+$-type contact region 30 provided in the back surface of the semiconductor layer 10. The SOG film 61L contains n-type impurity such as phosphorus (P) and arsenic (As). The SOG film 61L is primarily composed of silicon oxide (SiOx).

Next, as shown in FIG. 17B, a mask 76 is placed above the SOG film 61L. The mask 76 includes a glass plate 76g and a metal film 76m. The metal film 76m is selectively formed on the major surface of the glass plate 76g. The metal film 76m is a light shielding film for shielding laser light. The position and width of the opening 76h of the mask 76 correspond to the position and width of the contact region 31. The mask 76 may be replaced by the aforementioned mask 70, 71, 72.

Figure 18A:
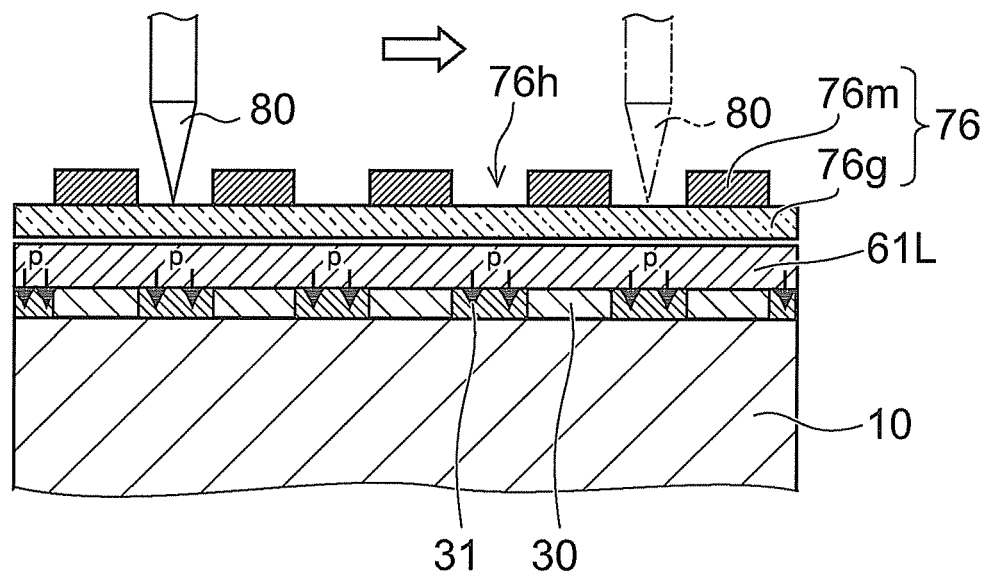
FIGS. 18A and 18B are main part sectional views illustrating processes for manufacturing the semiconductor device according to the third embodiment, where
Figure 18B:
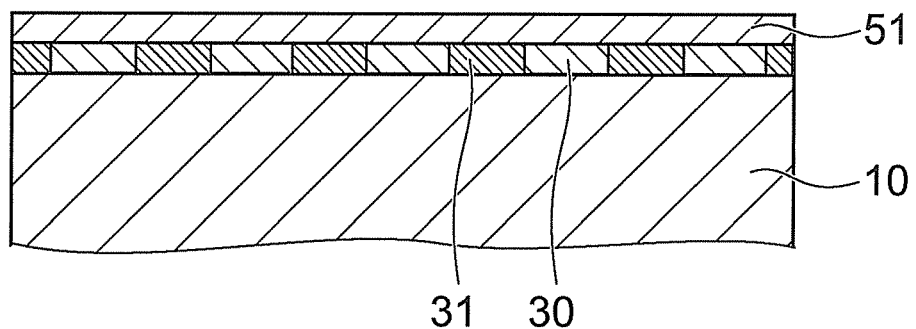

FIGS. 18A and 18B are main part sectional views illustrating the processes for manufacturing the semiconductor device according to the third embodiment. More specifically, FIG. 18A shows the laser annealing process, and FIG. 18B shows the process of forming a main electrode.

As shown in FIG. 18A, the SOG film 61L is irradiated with laser light 80 through the mask 76. The laser light 80 is slid parallel to the back surface of the semiconductor layer 10. At this time, the laser light 80 applied to the metal film 76m is reflected and does not reach into the SOG film 61L. On the other hand, the laser light 80 having passed through the opening 76h of the mask 76 reaches into the SOG film 61L. Then, the portion of the SOG film 61L irradiated with the laser light 80 is heated, and n-type impurity contained in the SOG film 61L thermally diffuses into the contact region 30. Thus, n-type impurity is selectively implanted into the contact region 30. The implantation of n-type impurity is adjusted so that the n-type impurity concentration exceeds the p-type impurity concentration. Furthermore, the n-type impurity is activated by laser annealing.

Thus, as shown in FIG. 18A, contact regions 30 and 31 are formed in the back surface of the semiconductor layer 10. Then, after removing the mask 76, the SOG film 61L is removed by etching.

Next, as shown in FIG. 18B, a second main electrode 51 made of e.g. aluminum (Al) is formed above the contact regions 30 and 31. A metal film made of e.g. titanium (Ti) is provided as necessary (not shown) between the second main electrode 51 and the contact region 31.

Thus, in the third embodiment, the contact region 31 is selectively formed in the contact region 30 while the SOG film 61L containing n-type impurity is brought into contact with the unprocessed contact region 30. As a result, during laser annealing, n-type impurity does not scatter from the contact region 31 to the contact region 30. Hence, as in the first embodiment, the contact characteristics between the contact region 30, 31 and the second main electrode 51 are improved.

Fourth Embodiment

Next, a method for manufacturing a semiconductor device according to a fourth embodiment is described.

Figure 19A:
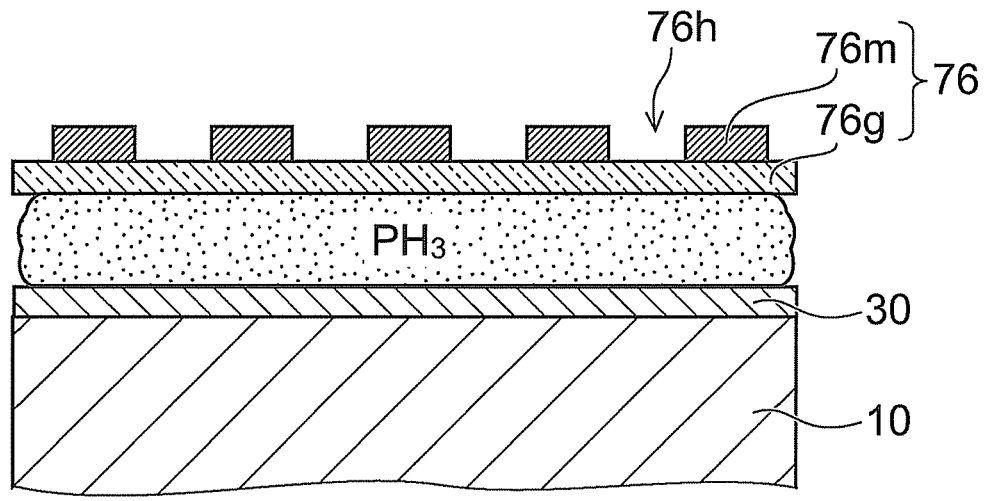
FIGS. 19A and 19B are main part sectional views illustrating processes for manufacturing a semiconductor device according to a fourth embodiment, where
Figure 19B:
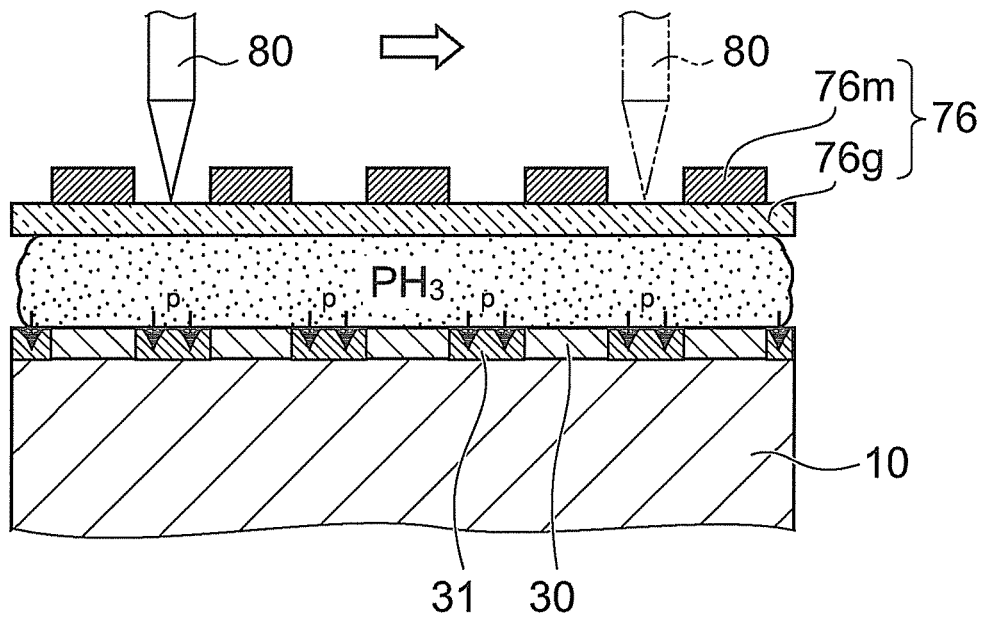

FIGS. 19A and 19B are main part sectional views illustrating the processes for manufacturing the semiconductor device according to the fourth embodiment. More specifically, FIG. 19A shows the process of placing a mask, and FIG. 19B shows the laser annealing process.

As shown in FIG. 19A, a mask 76 is opposed to the back surface of the semiconductor layer 10 including an unprocessed contact region 30. The contact region 30 has already been activated by irradiation with laser light. A prescribed distance is provided between the mask 76 and the contact region 30. Then, a gas containing n-type impurity is introduced between the mask 76 and the contact region 30. The gas containing n-type impurity can be e.g. phosphine gas (PH$_3$) or arsine (AsH$_3$). In the figures, phosphine gas is illustrated between the mask 76 and the contact region 30. The mask 76 may be replaced by the aforementioned mask 70, 71, 72.

Next, as shown in FIG. 198, the contact region 30 is irradiated with laser light 80 through the mask 76. The laser light 80 is slid parallel to the back surface of the semiconductor layer 10. At this time, the laser light 80 applied to the metal film 76m is reflected and does not reach into the phosphine gas. The laser light 80 having passed through the opening 76h of the mask 76 reaches the phosphine gas. Then, the phosphine gas irradiated with the laser light 80 is decomposed, and n-type impurity (phosphorus (P)) contained in the phosphine gas diffuses into the contact region 30. Thus, n-type impurity is selectively implanted into the contact region 30. The implantation of n-type impurity is adjusted so that the n-type impurity concentration exceeds the p-type impurity concentration. Furthermore, the n-type impurity is activated by laser annealing.

Thus, as shown in FIG. 19B, contact regions 30 and 31 are formed in the back surface of the semiconductor layer 10. Then, after removing the mask 76, a main electrode 51 is formed (not shown) above the contact regions 30 and 31.

Thus, in the fourth embodiment, the contact region 31 is selectively formed in the contact region 30 while a gas containing n-type impurity is brought into contact with the unprocessed contact region 30. As a result, during laser annealing, n-type impurity does not scatter from the contact region 31. Hence, as in the first embodiment, the contact characteristics between the contact region 30, 31 and the second main electrode 51 are improved.

Fifth Embodiment

Next, a method for manufacturing a semiconductor device according to a fifth embodiment is described.

Figure 20A:
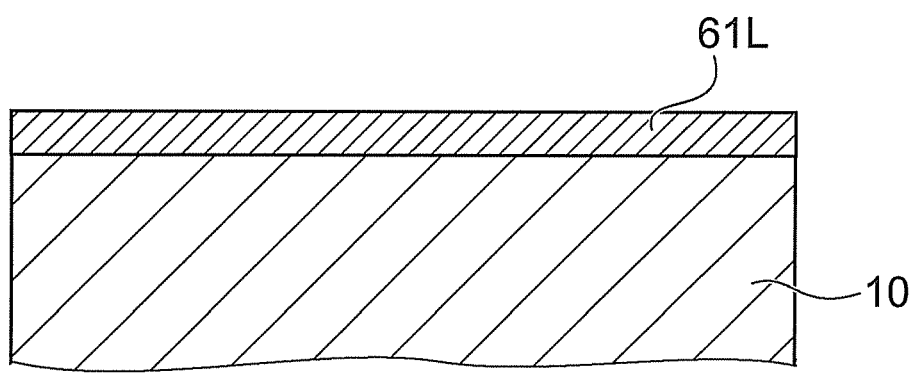
FIGS. 20A and 20B are main part sectional views illustrating processes for manufacturing a semiconductor device according to a fifth embodiment, where
Figure 20B:
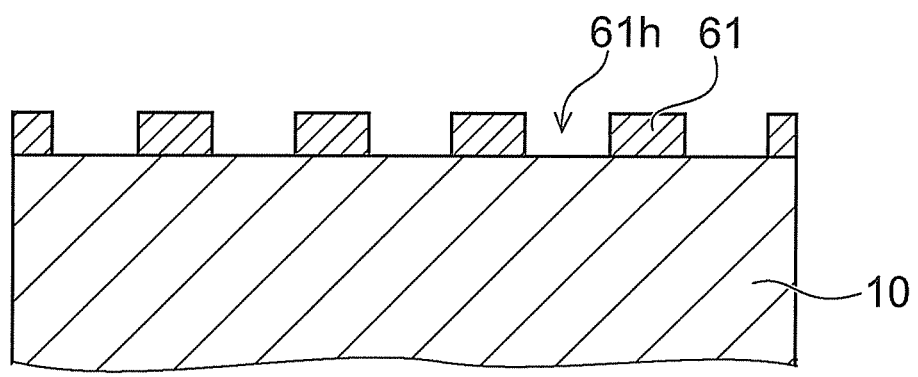

FIGS. 20A and 20B are main part sectional views illustrating the processes for manufacturing the semiconductor device according to the fifth embodiment. More specifically, FIG. 20A shows the process of forming an SOG film, and FIG. 20B shows the process of processing the SOG film.

As shown in FIG. 20A, an SOG film 61L is formed by spin coating on the back surface of the semiconductor layer 10. The SOG film 61L contains n-type impurity. The SOG film 61L is primarily composed of silicon oxide (SiOx). The n-type impurity is e.g. phosphorus (P) or arsenic (As).

Next, as shown in FIG. 20B, a patterned SOG film 61 is formed on the back surface of the semiconductor layer 10. Patterning of the SOG film 61L is performed by selective etching. The position and width of the opening 61h of the SOG film 61 correspond to the position and width of the contact region 31.

Figure 21A:
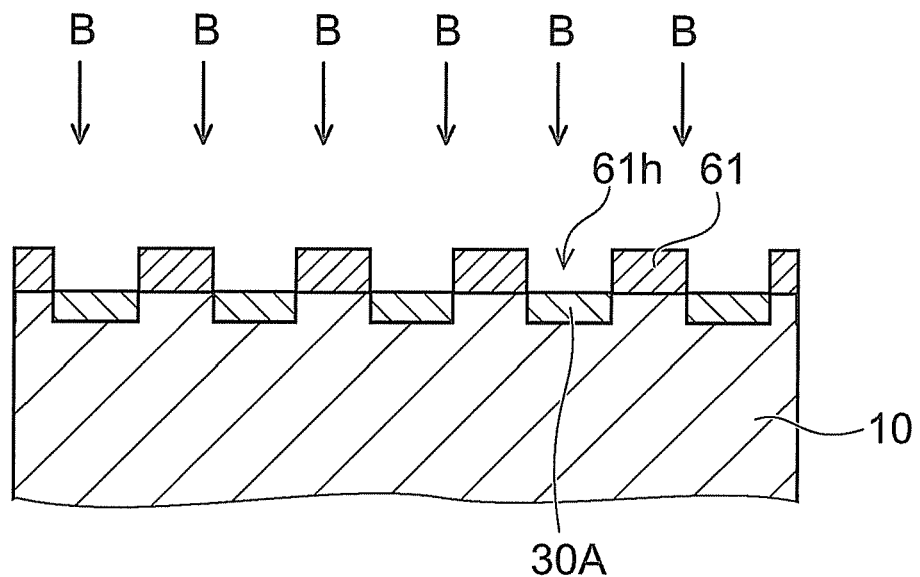
FIGS. 21A and 21B are main part sectional views illustrating processes for manufacturing the semiconductor device according to the fifth embodiment, where
Figure 21B:
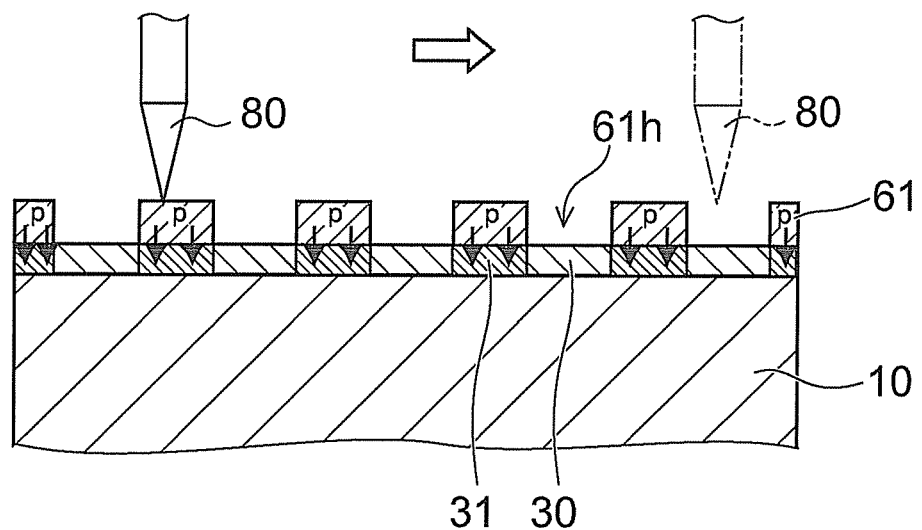

FIGS. 21A and 21B are main part sectional views illustrating the processes for manufacturing the semiconductor device according to the fifth embodiment. More specifically, FIG. 21A shows the process of implanting p-type impurity, and FIG. 21B shows the laser annealing process.

As shown in FIG. 21A, using the SOG film 61 as a blocking film, p-type impurity such as boron (B) is implanted into the back surface of the semiconductor layer 10. The p-type impurity is implanted into the back surface of the semiconductor layer 10 through the opening 61h of the SOG film 61, and an impurity implantation region 30A is selectively formed. The p-type impurity in the impurity implantation region 30A is adjusted to a prescribed concentration and a prescribed depth. For instance, the peak position of the impurity concentration profile of p-type impurity is adjusted to 0.05 μm or more and 0.3 μm or less.

Next, as shown in FIG. 21B, the SOG film 61 and the impurity implantation region 30A are irradiated with laser light 80. The laser light 80 is slid parallel to the back surface of the semiconductor layer 10. The SOG film 61 irradiated with the laser light 80 is heated, and n-type impurity contained in the SOG film 61 diffuses into the semiconductor layer 10. Furthermore, the n-type impurity is activated by laser light 80 transmitted through the SOG film 61. The laser light 80 having passed through the opening 61h of the SOG film 61 heats the impurity implantation region 30A. This activates the impurity implantation region 30A. Thus, contact regions 30 and 31 are formed in the back surface of the semiconductor layer 10.

Furthermore, after removing the SOG film 61 by etching, a second main electrode 51 made of e.g. aluminum (Al) is formed above the contact regions 30 and 31 as described above. A metal film made of e.g. titanium (Ti) is provided as necessary between the second main electrode 51 and the contact region 31.

Thus, in the fifth embodiment, the contact region 31 is selectively formed in the back surface of the semiconductor layer 10 while the SOG film 61 is brought into contact with the back surface of the semiconductor layer 10. As a result, during laser annealing, n-type impurity does not scatter from the contact region 31.

The embodiments have been described above with reference to examples. However, the embodiments are not limited to these examples. That is, those skilled in the art can suitably modify these examples, and such modifications are also encompassed within the scope of the embodiments as long as they fall within the spirit of the embodiments. For instance, various components of the above examples and their layout, material, condition, shape, size and the like are not limited to those illustrated above, but can be suitably modified and combined. The first conductivity type may be n-type, and the second conductivity type may be p-type. Furthermore, the manufacturing process of the embodiments is not limited to the sequence described with reference to the drawings. In the manufacturing process of the embodiments, the sequence may be suitably reordered as necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
   forming a base region and an emitter region in a front surface of a semiconductor layer;
   forming a first impurity implantation region by implanting first impurity of a first conductivity type into a back surface of the semiconductor layer;
   selectively forming a second impurity implantation region by selectively implanting second impurity of a second conductivity type into the first impurity implantation region; and
   irradiating the first impurity implantation region and the second impurity implantation region with laser light,
   a peak of impurity concentration profile in a depth direction of at least one of the first impurity implantation region and the second impurity implantation region before irradiation with the laser light being adjusted to a depth of 0.05 μm or more and 0.3 μm or less from the back surface of the semiconductor layer, and
   after etching a surface of the first impurity implantation region, the second impurity being implanted into the first impurity implantation region.

2. The method according to claim 1, wherein in a state where upper side of the first impurity implantation region is covered with a blocking portion and the second impurity implantation region is not covered with the blocking portion, while the first impurity implantation region is irradiated with the laser light through the blocking portion, the second impurity implantation region is irradiated with the laser light.

3. A method for manufacturing a semiconductor device, comprising:
   forming a base region and an emitter region in a front surface of a semiconductor layer;
   forming a first impurity implantation region by implanting first impurity of a first conductivity type into a back surface of the semiconductor layer;
   irradiating the first impurity implantation region with laser light;
   forming a layer containing second impurity of a second conductivity type on the first impurity implantation region;
   placing a mask selectively shielding the laser light above the layer containing the second impurity; and
   selectively irradiating the layer containing the second impurity with the laser light through an opening provided in the mask,
   a peak of impurity concentration profile in a depth direction of the first impurity implantation region before the irradiating the first impurity implantation region with the laser light being adjusted to a depth of 0.05 μm or more and 0.3 μm or less from the back surface of the semiconductor layer.

4. The method according to claim 3, wherein the layer containing the second impurity is an oxide film containing the second impurity.

5. The method according to claim 3, wherein the layer containing the second impurity is a gas containing the second impurity.

6. The method according to claim 3, wherein
   by selectively heating the layer containing the second impurity by irradiation with the laser light, the second impurity in a portion of the layer containing the second impurity irradiated with the laser light is diffused into the first impurity implantation region, and
   the second impurity is diffused into the first impurity implantation region so that after diffusion of the second impurity, concentration of the second impurity in the first impurity implantation region exceeds impurity concentration of the first impurity in the first impurity implantation region.

7. A method for manufacturing a semiconductor device, comprising:
   forming a base region and an emitter region in a front surface of a semiconductor layer; and
   selectively forming a first impurity implantation region and a second impurity implantation region in a back surface of the semiconductor layer,
   the selectively forming including:
      selectively forming an oxide film containing second impurity of a second conductivity type on the back surface of the semiconductor layer;
      selectively forming the first impurity implantation region in the back surface of the semiconductor layer exposed through the oxide film by implanting first impurity of first conductivity type into the back surface of the semiconductor layer exposed through the oxide film; and
   irradiating the oxide film and the first impurity implantation region with laser light,
   a peak of impurity concentration profile in a depth direction of the first impurity implantation region before the irradiating the first impurity implantation region with the laser light being adjusted to a depth of 0.05 μm or more and 0.3 μm or less from the back surface of the semiconductor layer.

* * * * *